United States Patent [19]

Yamanaka et al.

[11] Patent Number: 5,296,729
[45] Date of Patent: Mar. 22, 1994

[54] SEMICONDUCTOR MEMORY DEVICE HAVING STATIC RANDOM ACCESS MEMORY

[75] Inventors: Toshiaki Yamanaka, Iruma; Norio Hasegawa; Toshihiko Tanaka, both of Tokyo; Takashi Hashimoto, Hachioji; Koichiro Ishibashi, Tokyo; Naotaka Hashimoto, Kokubunji; Akihiro Shimizu, Akishima; Yasuhiro Sugawara, Hachioji; Tokuo Kure, Tokyo; Shimpei Iijima, Akishima; Takashi Nishida, Tokyo; Eiji Takeda, Koganei, all of Japan

[73] Assignees: Hitachi, Ltd., Tokyo; Hitachi VLSI Engineering Corp., Kodaira, both of Japan

[21] Appl. No.: 782,623

[22] Filed: Oct. 25, 1991

[30] Foreign Application Priority Data

Oct. 26, 1990 [JP] Japan .................. 2-287058

[51] Int. Cl.⁵ .................. H01L 27/02; H01L 29/00; H01L 29/78
[52] U.S. Cl. .................. 257/377; 257/69; 257/369; 257/382; 257/383; 257/393; 257/903
[58] Field of Search .................. 257/66, 67, 369, 377, 257/382, 383, 393, 903

[56] References Cited

U.S. PATENT DOCUMENTS 4,481,524 11/1984 Tsujide .................. 357/42
5,132,771 7/1992 Yamanaka et al. .................. 257/903

FOREIGN PATENT DOCUMENTS 63-29576 7/1986 Japan .
2-78216 9/1988 Japan .

OTHER PUBLICATIONS

T. Terasawa et al.: "0.3-micron Optical Lithography Using a Phase-Shifting Mask", SPIE vol. 1088 Optical/Laser Microlithography II (1989), pp. 25–33.

Primary Examiner—Ngan Ngo
Attorney, Agent, or Firm—Antonelli, Terry, Stout & Kraus

[57] ABSTRACT

There is provided a technique capable of reducing the electrode resistance by widening the effective area of an electrode in a cell for a standard potential supply connected to the memory cell. There is also provided a technique capable of reducing the memory cell area by reducing the area necessary for separation between the electrode in a cell for the standard potential supply and adjacent other electrodes. Two transfer MOS transistors of a first conductivity type and two driver MOS transistors are provided. A conductive layer for fixing the source potential of the driver MOS transistors to standard potential is so disposed above the transfer and driver MOS transistors as to the wholly cover the memory cell. Separation is carried out by using a photo-mask having an optically transparent substrate provided within the same transmissive portion with a pattern of a plurality of so-called phase shifter regions for inversion of the phase of transmitting light.

4 Claims, 23 Drawing Sheets

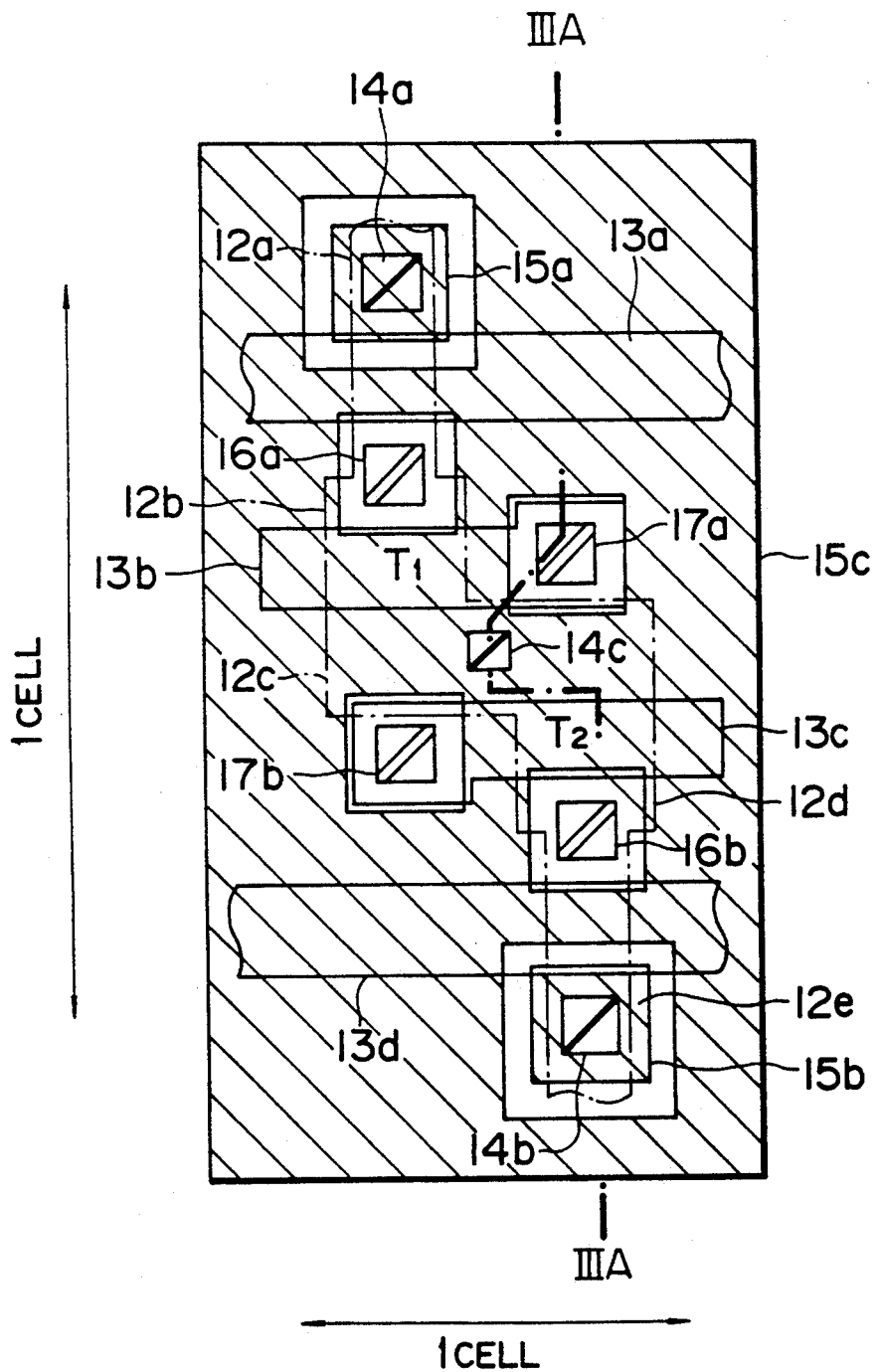
FIG. IA

SEMICONDUCTOR MEMORY DEVICE HAVING STATIC RANDOM ACCESS MEMORY

BACKGROUND OF THE INVENTION

This invention relates to semiconductor devices and a method of making the devices, and, more particularly, to a semiconductor memory device having a static random access memory and a method of making the same.

A conventional highly-integrated static random access memory (SRAM) using insulated gate field effect transistors (IGFET's: hereinafter referred to as MOS transistors which are most typical) has a construction as shown in an equivalent circuit of FIG. 2A. This SRAM comprises a flip-flop circuit having two driver MOS transistors T1 and T2 coupled with each other in cross connection, highly resistive elements R1 and R2 for supplying extremely small currents to two store nodes N1 and N2 of the flip-flop circuit so as to store data connected to the store nodes N1 and N2, and transfer MOS transistors T3 and T4 for "write" and "read" of data which is to be connected to or which has been connected to the store nodes N1 and N2.

The flip-flop circuit is supplied with standard voltages such as power supply voltage Vcc and grounded potential GND, and the transfer MOS transistors are connected with data lines 1 and 1', having their gates connected in common to a word line 2.

As well known in the art, such a SRAM cell operates as follows More particularly, when the word line 2 is activated to, typically, higher potential, "high" or "low" data from the data lines are stored at the store nodes N1 and N2 through the transfer MOS transistors or conversely, statuses of the store nodes are read out to the data lines.

At present, the above type of memory cell having four MOS transistors and two highly resistive elements is used as a highly-integrated SRAM cell of the most general type. Recently, however, to ensure low-power consumption operations at low voltage, MOS transistors formed on a polycrystalline silicon layer have been used in place of the highly resistive load.

FIG. 2B diagrammatically shows a planar configuration of the conventional memory cell comprised of the four MOS transistors and two highly resistive elements. In the figure, gate electrodes 5b and 5c correspond to the gate electrodes of the driver MOS transistors T1 and T2 shown in FIG. 2A and a gate electrode 5a corresponds to the common gate, serving as the word line, of the transfer MOS transistors T3 and T4 shown in FIG. 2A. A highly concentrated n-type impurity region 3d serving as the drain of the driver MOS transistor T1 is in common to an n-type impurity region of the transfer MOS transistor T3.

A highly concentrated n-type impurity region 3e serving as the drain of the driver MOS transistor T2 is electrically connected, at the bottom of a contact hole 8a, to an n-type impurity region 3c of the transfer MOS transistor T4 by the gate electrode 5b. The contact hole 8a intervenes between the gate electrode 5b and a low resistivity polycrystalline silicon layer 9a.

The gate electrode 5c of the driver MOS transistor T2 is connected to the n-type impurity region 3d common to the transfer MOS transistor T3 and driver MOS transistor T1 to establish the cross connection in the flip-flop circuit of the static random access memory cell.

Contact holes 6a and 6b are respectively opened through highly concentrated n-type impurity regions 3f and 3g serving as the sources of the driver MOS transistors T1 and T2 to ensure electrical connection of the sources to a second layer in the form of a conductive layer 7.

Standard voltage is supplied to the sources of the driver MOS transistors T1 and T2 through this conductive layer 7. In order to prevent grounded potential from being raised by current flowing in the memory cell, the second layer acting as the conductive layer 7 is formed of a composite film (polycide film) having a low resistive polycrystalline silicon layer and a refractory silicide layer.

Contact holes 8a and 8b are respectively opened through the gate electrodes 5b and 5c, and highly resistive polycrystalline silicon layers 9c and 9d are connected to the gate electrodes 5b and 5c through low resistivity polycrystalline silicon layers 9a and 9b. A low resistivity polycrystalline silicon layer 9e serves as a common power supply electrode for feeding power supply voltage to the highly resistive polycrystalline silicon layers.

Aluminum electrodes 11a and 11b correspond to the two data lines in the memory cell, and they are electrically connected to highly concentrated n-type impurity regions 3a and 3b of the transfer MOS transistors T4 and T3 through contact holes 10a and 10b.

The prior art as discribed above is disclosed in, for example, JP-A-63-29576 which corresponds to an anterior application by the present applicant, and it features that the area of an electrode in a cell for standard potential supply connected to the memory cell can be reduced and the degree of integration of SRAM can be improved.

U.S. patent application Ser. No. 07/503,928 by some of the present inventors pertains to a SRAM.

SUMMARY OF THE INVENTION

The present inventors have studied improvements on the degree of integration in the SRAM cell employing the aforementioned prior art technique to find the following points are problematic.

More particularly, when in the aforementioned prior art cell the memory cell area is reduced to comply with the need for high integration, the width of an electrode in the form of the conductive layer 7 for supply of standard voltage to the source of the driver MOS transistors T1 and T2 becomes small correspondingly.

Further, since the number of memory cells is increased as the capacity increases, the number of cells connected to the conductive layer 7 serving as an electrode in a cell for standard potential supply increases.

Accordingly, as compared to the prior art, an increase in potential on the electrode in a cell for standard potential supply connected with terminal cells becomes considerably large, thereby degrading the static noise margin of the memory cell.

Under these circumstances, the resistance of the electrode in a cell for standard potential supply needs to be decreased, and to this end the thickness and/or width of the electrode must be increased. Disadvantageously, however, with the thickness of the electrode increased, the process for production of the electrode in a cell for standard potential supply including dry etching becomes difficult to achieve because of the high step height and with the width increased, the area required for the electrode in a cell for standard potential supply is unduly increased to prevent improvement on the degree of integration of the SRAM.

According to the invention, two transfer MOS transistors of a first conductivity type and two driver MOS transistors of the first conductivity type are formed in a substrate, and a conductive layer for fixing source potential of the driver MOS transistors to standard voltage is so disposed above the MOS transistors as to wholly cover the memory cell.

Further, according to the invention, to achieve separation between the electrode in a cell for standard potential supply connected to the memory cell and adjacent different electrodes (for example, pads connected to electrodes of data lines) in a semiconductor memory device, a photo-mask is used which has an optically transparent substrate provided within the same transmissive portion with a pattern of a plurality of so-called phase shifter regions for inversion of the phase of transmitting light.

With the above constructions, the memory cell area can be reduced while reducing the resistance of the resistive electrode in the form of the conductive layer for fixing source potential of the driver MOS transistor to the standard voltage, and, therefore, a highly integrated semiconductor device can be provided in which current flowing in the memory cell will not raise grounded potential for the memory cell to permit stable memory operation even with a power supply of low voltage.

An object of the invention is to provide a technique which can reduce the electrode resistance by widening the effective area of the electrode in a cell for standard potential supply connected to the memory cell in a semiconductor memory device.

Another object of the invention is to provide a technique which can reduce the memory cell area by reducing the area necessary for separation between the electrode in a cell for standard potential supply connected to the memory cell and adjacent different electrodes in a semiconductor memory device.

These and other objects and many of the attendant advantages of the present invention will be readily appreciated as the same becomes better understood by reference to the following detailed description when considered in connection with the accompanying drawings.

BRIEF DESCRIPTION OF THE DRAWINGS

FIGS. 1A and 1B are plan views showing a first embodiment of the invention;

DESCRIPTION OF THE PREFERRED EMBODIMENTS

Figure 1B:
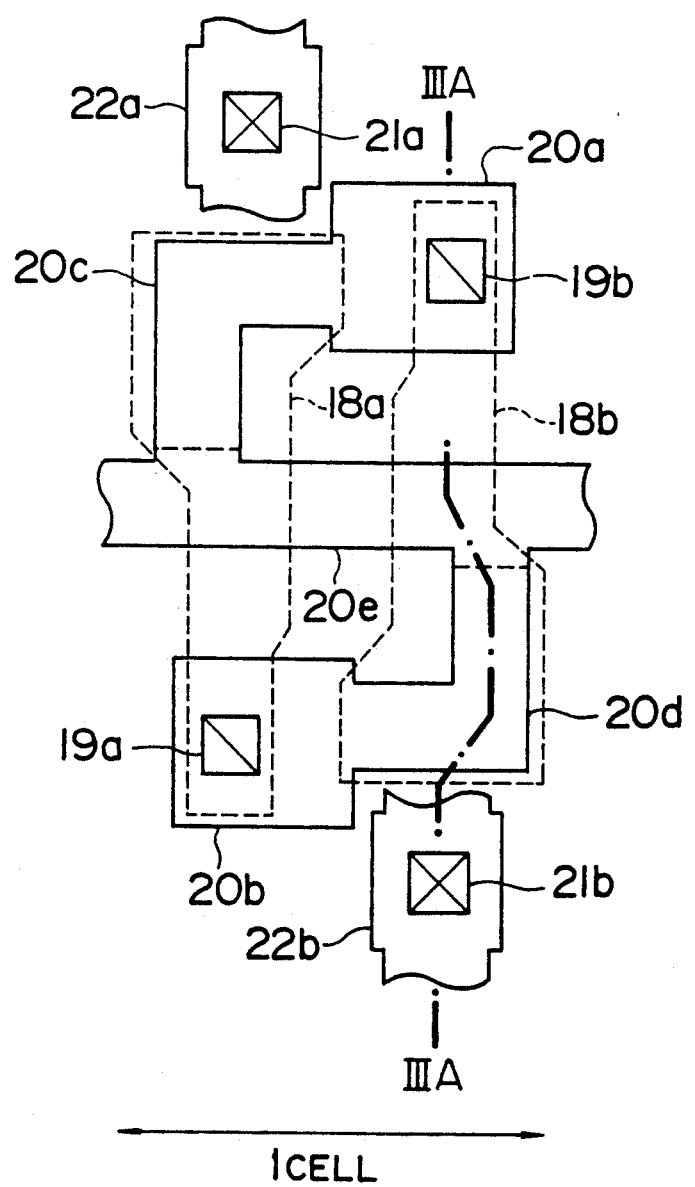

The invention will now be described in greater detail by way of example with reference to the accompanying drawings. Throughout the drawings, reference characters 1 and 1' designate a first selection line which is, in specific form, a data line; 2 a second selection line which is a word line specifically; 3a to 3f and 12a to 12e a highly concentrated n-type impurity region; 4a to 4c, 6a and 6b, 8a and 8b, 10a and 10b, 14a to 14c, 16a and 16b, 17a and 17b , 19a and 19b, and 21a and 21b a contact hole; 5a to 5c, 13, and 13a to 13d a gate electrode; 7, and 15a to 15c a second layer in the form of a conductive layer; 9a to 9e a low resistivity polysilicon layer; 9c and 9d a highly resistive polysilicon layer; 11a and 11b, 22a and 22b, and 42 an aluminum electrode; 18a and 18b a PMOS gate electrode and cross connection electrode of flip-flop circuit; 20a and 20b a polysilicon PMOS drain region; 20c and 20d a polysilicon PMOS channel region; 20e a polysilicon PMOS common source region; 23 a body for formation of a device which is, in specific form, an n-type substrate; 24 a p-type well; 25 a field insulation layer (oxide layer); 26 a gate insulation layer (oxide layer); 27 a spacer insulation layer; 28 an insulation layer (silicon nitride layer); 29, 32, 38 and 41 silicon oxide layer; 31 a polysilicon PMOS gate insulation layer; 33 a glass plate (mask plate); 34 a phase shifter layer; 35 projecting light; 36 a photoresist; 37 a layer to be etched; 39 a selectively formed polysilicon layer; 40 a tungsten electrode; 43 an IC card; 44 a SRAM chip; 45 a battery of about 1 V; 46 a mask aperture; 47 an extremely small gap formed in resist; 48 a mask having a phase shifter layer; 49 a photomask; and 50 a low concentrated n-type impurity region.

Embodiment 1

In an SRAM memory comprised of a pair of inverters each using lamination type complementary MOS transistors, the present embodiment is directed to an example where a second layer serving as a conductive layer is provided to form an electrode for supply of standard voltage (grounded potential) to the memory cell as a plate-like electrode which covers the entire surface. With the term "plate-like", it is meant that the conductive layer thus formed is continuous in directions of both the word and data lines.

Figure 1C:
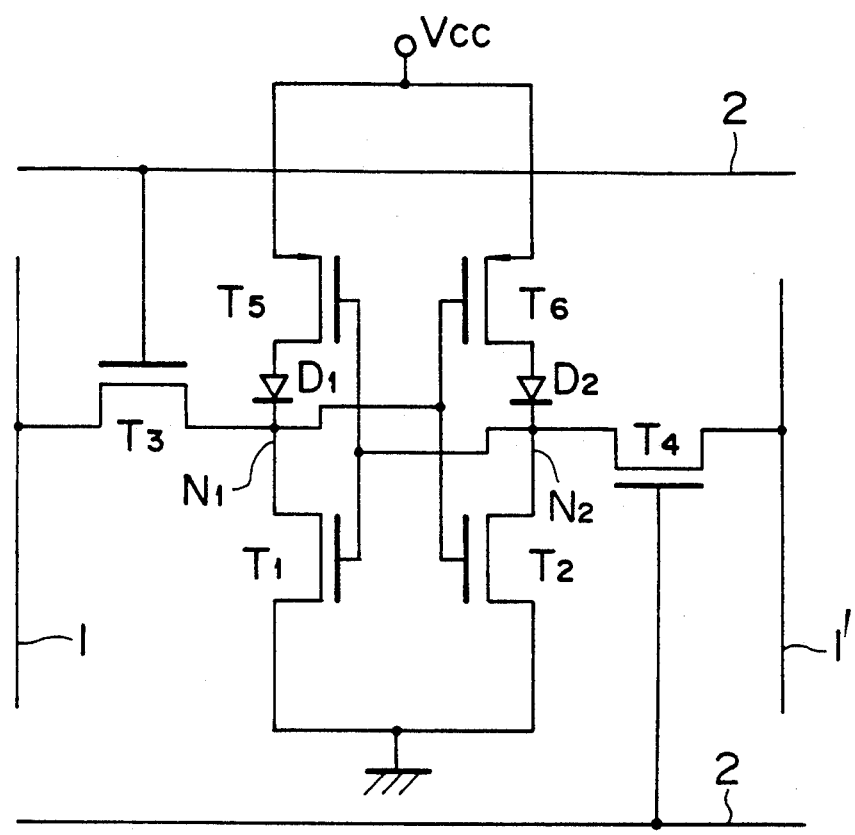
FIG. 1C is an equivalent circuit diagram of the first embodiment of the invention.
Figure 2A:
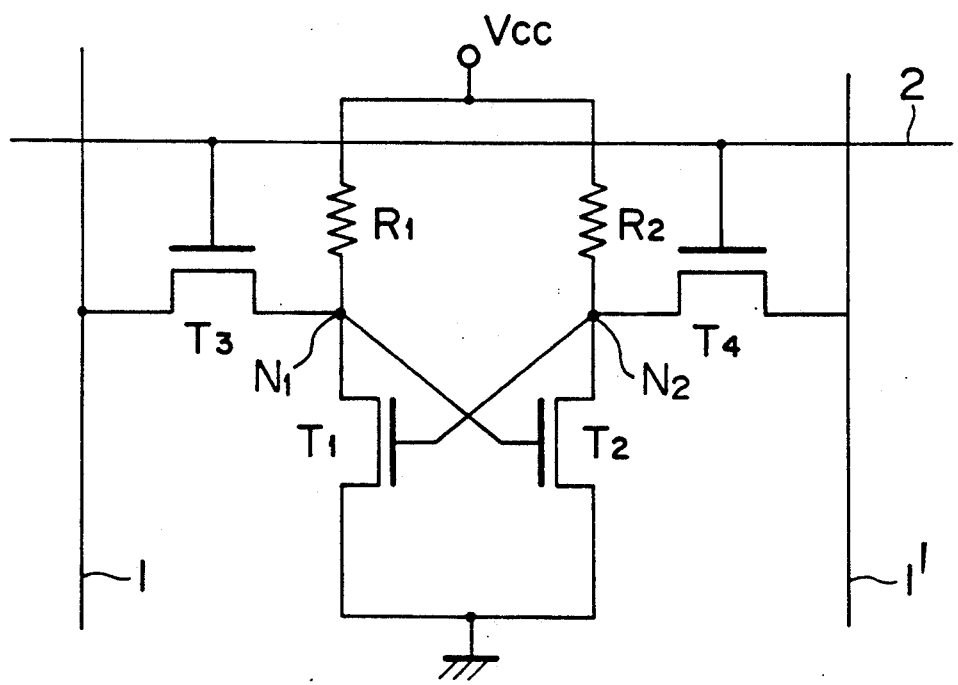
FIG. 2A is an equivalent circuit diagram showing a prior art arrangement.
Figure 2B:
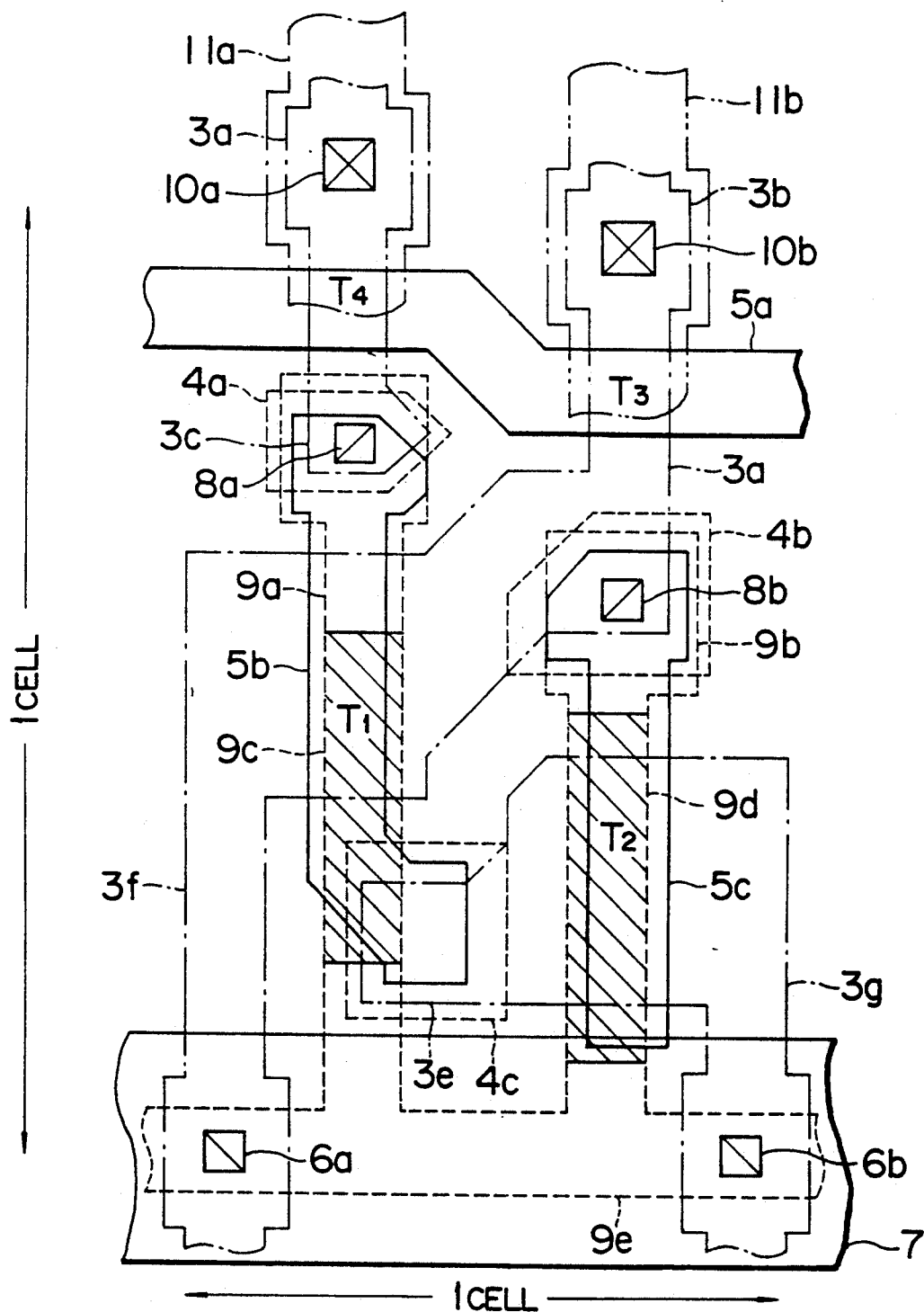
FIG. 2B is a plan view of the prior art arrangement.

FIGS. 1A and 1B show, in plan view form, a cell of one bit of a SRAM according to the invention, and FIG. 1C shows an equivalent circuit of the cell.

Figure 3A:
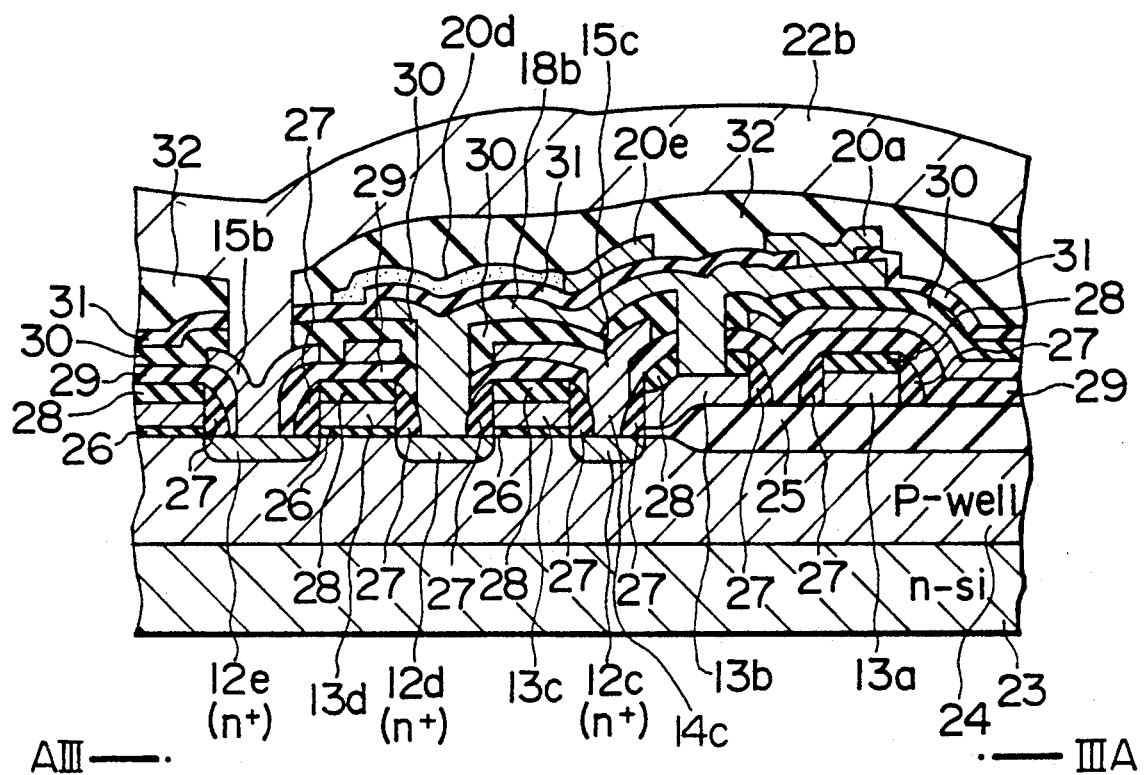
FIG. 3A is a sectional view showing the first embodiment of the invention.
Figure 3B:
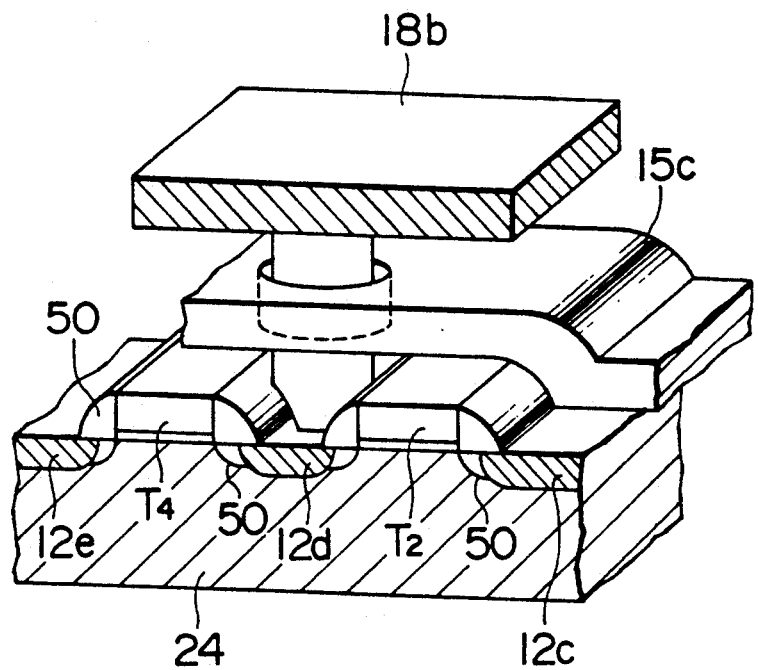
FIG. 3B is a perspective view showing the first embodiment of the invention.

Further, a sectional structure along the line IIIA—IIIA of FIGS. 1A and 1B is depicted in FIG. 3A and the neighborhood of a highly concentrated n-type impurity region 12d is illustrated for better understanding thereof in a perspective view of FIG. 3B. Mainly, FIG. 3A is depicted based on the line IIIA—IIIA of FIG. 1B. However, partly, FIG. 3A is depicted based on the line IIIA—IIIA of FIG. 1A to illustrate the contact hole 14C.

In particular, FIG. 1A is a plan view showing a portion of driver MOS transistors of n-channel, transfer MOS transistors of n-channel and a ground electrode, and FIG. 1B is a plan view showing a portion of loading MOS transistors of p-channel formed in a polysilicon layer.

Referring to FIGS. 1A to 1C and FIGS. 3A and 3B, the n-channel driver MOS transistors T1 and T2 and n-channel transfer MOS transistors T3 and T4, as best seen in FIG. 1C, are formed in a p-type well (an island region of p-type impurity) 24, as best seen in FIG. 3A, which is formed in an n-type silicon substrate 23.

Any of gate electrodes 13a, 13b, 13c and 13d correspond to a first-layer polysilicon layers added with n-type impurity.

Preferably, for the purpose of making the gate electrode have a low resistance, the gate electrode may be formed of a composite film having a compound (silicide: $WSi_2$, $MoSi_2$, $TiSi_2$ or $TaSi_2$) of a refractory metal and silicon and a polysilicon layer.

Above a highly concentrated n-type impurity region 12c (FIG. 3A) serving as a common source of the n-channel driver MOS transistors T1 and T2, a contact hole 14c (FIG. 1A) opens through the silicon oxide layer (FIG. 3A).

A second level of conductive layer (second-layer conductive layer) 15c for fixing source potential of all of the driver MOS transistors included in the memory cell to grounded potential is connected to the highly concentrated n-type impurity region 12c through the contact hole 14c.

In contact holes 14a and 14b through which aluminum electrodes 22a and 22b serving as data lines are connected to highly concentrated n-type impurity regions 12a and 12e of the transfer MOS transistors T3 and T4, second level conductive layers 15a and 15b for contact pads are provided.

The aluminum electrodes 22a and 22b are connected to the conductive layers 15a and 15b as contact pads through contact holes 21a and 21b.

The same second layer formed of a polysilicon layer added with n-type impurity at a high concentration is used for the conductive layers 15a and 15c for contact pads and the plate-like conductive layer 15c for ground electrode, and the distance between the conductive layer 15c for ground electrode and each of the conductive layers 15a and 15b for contact pads is 0.1 to 0.4 $\mu$m (FIG. 1A).

A method of making this cell will be detailed later.

The second layer used as the conductive layers 15a and 15b for contact pads and plate-like conductive layer 15c ground electrode may be made of a material other than the above.

In this case, at least the conductive layer 15c may be made of a low resistivity material and for example, it may be made of a compound of refractory metal such as tungsten or titanium and silicon or may be formed of a composite film of the compound and a polysilicon layer.

Further, the cross connection in the flip-flop circuit of the SRAM cell can be achieved as follows.

More particularly, a third level of polysilicon layer 18a connects a highly concentrated n-type impurity region 12b and the gate electrode 13c, and the third-layer polysilicon layer 18b connects a highly concentrated n-type impurity region 12d and the gate electrode 13b.

The second-layer conductive layer 15c can be insulated electrically from the third level of conductive layers 18a and 18b for the above connection by a self-aligned technique.

As a result, contact holes 16a and 17b through which the third-layer polysilicon layer 18a connects to the highly concentrated n-type impurity region 12b and gate electrode 13c and contact holes 16b and 17a through which the third-layer polysilicon layer 18b connects to the highly concentrated n-type impurity region 12d and gate electrode 13b are respectively spaced apart from the second-layer conductive layer 15c by a predetermined distance of 0.1 to 0.4 $\mu$m.

Referring to FIG. 3B for better understanding of the electrically-insulated structure achievable by the self-aligned technique, it will be appreciated that the third-layer polysilicon 18b connects to the highly concentrated n-type impurity region 12d while being spaced apart from the second-layer conductive layer 15c by a predetermined distance For clarity of illustration, the electrodes and polysilicon PMOS transistors are omitted in FIG. 3B.

In the embodiment shown in the figure, a so-called LDD (Lightly Doped Drain) structure having a low concentrated n-type impurity region 50 is provided for the source and drain of MOS transistor is used to prevent the MOS transistor from being degraded in reliability during long-term use thereof.

At least part of the third-layer polysilicon layers 18a and 18b shown in FIGS. 1B and 3A correspond to the gate electrodes of polysilicon PMOS transistors T5 and T6 shown in FIG. 1C which are formed through lamination.

Further, above at least the gate electrodes, gate insulation layers 31 of the polysilicon PMOS transistors T5 and T6 are formed.

Furthermore, above at least the gate insulation layers 31, a fourth layer of polysilicon serving as channel regions 20c and 20d of the polysilicon PMOS transistors T5 and T6 is formed.

Accordingly, the laminated gate electrodes 18a and 18b of the polysilicon PMOS transistors T5 and T6 underlie the channel regions 20c and 20d.

Drain regions 20a and 20b of the polysilicon PMOS transistors T5 and T6 are formed in the same layer as that of the channel regions 20c and 20d, that is, in the fourth-layer polysilicon layer.

The respective drain regions 20a and 20b are connected through contact holes 19b and 19a to gate electrodes 18b and 18a of the mutually partner polysilicon MOS transistors in the flip-flop circuit.

A source region 20e common to the polysilicon PMOS transistors T5 and T6 is also formed in the fourth-layer polysilicon layer to serve as a common electrode for feeding in the memory.

Through this electrode for feeding, constant voltage is supplied to the sources of all of the polysilicon PMOS transistors in the memory.

The gate electrodes 13a and 13d of the transfer MOS transistors T3 and T4 are electrically connected to the word line.

Specifically, the gate electrodes are elongated and extended to form the word line.

The aluminum electrodes 22a and 22b serving as the data lines 1 and 1' are connected to the highly concentrated n-type impurity regions 12a and 12b serving as the source and drain (active regions) of the respective transfer MOS transistors T3 and T4 through the contact holes 21a and 21b. The contact holes 21a and 22b are opened through silicon nitride layer 30, silicon oxide layer 32 and gate insulation layer 31 of polysilicon PMOS transistors.

Referring now to FIGS. 4A to 4F, a process of fabricating the present embodiment will be described.

FIGS. 4A to 4F show, in sectional form taken on the line A—A' in the plan views of FIGS. 1A and 1B, steps of the fabrication process of the SRAM cell according to the invention.

In the present embodiment, all of the MOS transistors used for the memory cell and formed in the surface of the silicon substrate are n-channel MOS transistors formed in the p-type well 24 and complementary MOS (CMOS) circuits utilizing two wells are used as a memory peripheral circuit.

Alternatively, however, a single structure of p-type well or n-type well may be used for the formation of the cell.

Also, for the sake of ensuring supply of a plurality of power supply voltages to the memory peripheral circuit, a well structure of three or more types of well may be used in which a well of the same conductivity type as that of the substrate is surrounded by a well of opposite conductivity type to electrically insulate the fomer well from the substrate.

It is to be noted that in the present embodiment only the fabrication process of the memory cell part is described and the peripheral CMOS circuit can be fabricated by using the conventional technique.

Firstly, a p-type well 24 having an impurity concentration of $10^{16}$ to $10^{17}$ cm$^{-3}$ and a depth of 2 to 3 μm is formed in an n-type silicon substrate 23 having a resistivity of about 10 Ωcm through the known process.

Subsequently, a p-type channel stopper layer and a silicon oxide layer (field oxidized layer) 25 for device separation having a thickness of 300 to 500 nm are formed by using the selective oxidization method and then a gate oxide layer 26 of a thickness of 5 to 20 nm is formed at a portion which is designed to be an active region of MOS transistors.

In forming the field oxidized layer 25, the channel stopper layer for prevention of N-upset is typically formed under the field oxidized layer but its illustration is omitted in the drawings.

Figure 4A:
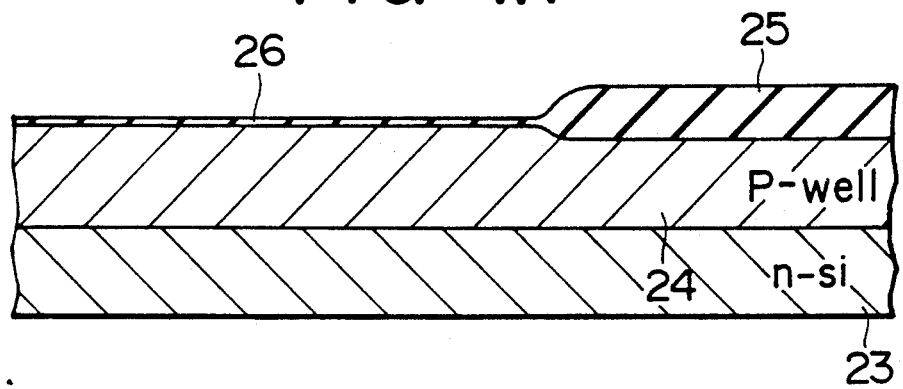
FIGS. 4A to 4F are sectional views showing the fabrication process of the first embodiment of the invention in sequence of steps.

The impurity concentration distribution in the well may be such that the impurity concentration increases as the depth increases and in this case, ion implantation may be carried out at a plurality of levels of energy to form the p-type well (FIG. 4A).

Subsequently, ion implantation for adjustment of threshold voltage of MOS transistors is carried out.

When BF2 ions, for example, are used at a level of energy of 40 keV for ion implantation, the amount of ion implantation is preferably about $10^{12}$ cm$^{-2}$.

Thereafter, a polysilicon layer 13 having a thickness of, for example, 200 nm is deposited through low pressure chemical vapor deposition (LPCVD) process and then an n-type impurity such as phosphorus is introduced by using, for example, vapor diffusion process.

Then an insulation layer 28 such as a silicon nitride layer is deposited to, for example, 100 nm thickness through the LPCVD process.

Thereafter, the insulation layer 28 and polysilicon layer 13 are processed into patterns of the gate electrodes 13a to 13d by photolithography and dry etching.

Subsequently, the gate electrodes 13a to 13d are used as masks for ion implantation to carry out ion implantation of ions of n-type impurity such as arsenic at an amount of, for example, about $10^{15}$ cm$^{-2}$.

The resulting structure is annealed at 800° to 900° C. in ambient atmosphere of nitrogen to form highly concentrated n-type impurity regions 12a to 12e of a depth of 0.1 to 0.2 μm.

It is preferable that the gate electrodes 13a to 13d and the insulation layer 28 of silicon nitride layer overlying them have optimum thicknesses in accordance with process dimensions and conditions of dry etching.

A tantalum oxide layer (Ta) 205 having a lower etching rate than the silicon oxide layer may be used as the insulation layer 28.

Addition of impurity to the polysilicon layer serving as the gate electrode may be effected using either the ion implantation method or the method (doped polysilicon) introduced for formation of the polysilicon layer.

Preferably, the material of the gate electrode is a low resistive electrode material in order to reduce access delay of the word line.

Figure 4B:
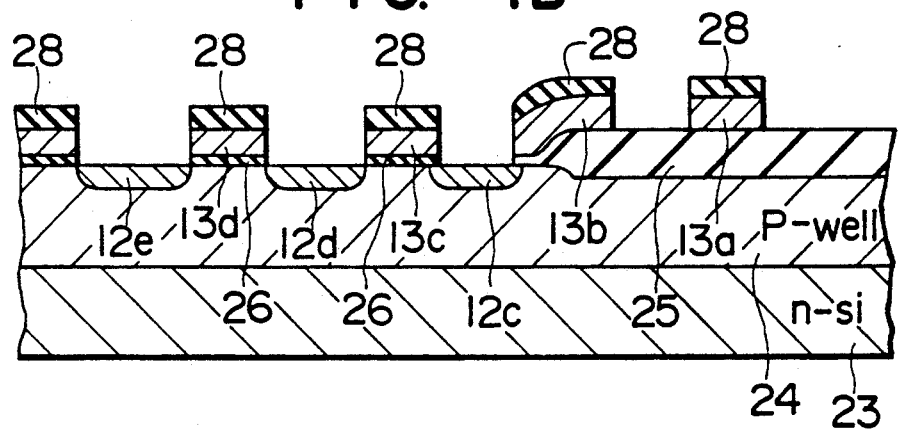

Specifically, the gate electrode may preferably be formed of a composite film having a compound (silicide: WSi$_2$, MoSi$_2$, TiSi$_2$ or TaSi$_2$) of such a low resistive refractory metal as tungsten, molybdenum, tantalum or titanium and silicon and a polysilicon layer (FIG. 4B).

Thereafter, a silicon oxide layer is deposited process to 200 to 400 nm thickness through the LPCVD and the entire surface of the deposited silicon oxide layer is etched by anisotropic dry etching to form insulation layers (spacer insulation layers) 27 serving as spacers which surround the side wall of the gate electrodes 13a to 13d.

Subsequently, a silicon oxide layer 29 is deposited to about 100 nm thickness through the LPCVD process and the deposited layer is subjected to photolithography and dry etching to form or open contact holes (14a to 14c in FIG. 1A), though not depicted in the sectional view, in the silicon oxide layer 29.

A second polysilicon layer is then deposited to about 100 nm thickness and ion implantation of, for example, arsenic is effected to introduce n-type impurity so that the second polysilicon layer may have an impurity concentration of $10^{19}$ to $10^{21}$ cm$^{-3}$.

Thereafter, the resulting layer is patterned into ground electrode 15c and contact pads 15a and 15b by using photolithography and dry etching.

Openings are provided such that the ground electrode 15c is spaced apart from each of the contact pads 15a and 15b by a distance of 0.1 to 0.4 μm and is also spaced apart from each of the contact holes (16a, 16b, 17a and 17b in FIG. 1A) for the gate electrodes 18a and 18b of polysilicon PMOS transistors by a distance of 0.1 to 0.4 μm.

It is preferable that a thin silicon oxide layer be formed in advance of the ion implantation.

It is desirable that the amount of ion implantation and the level of energy be set to optimum values in accordance with the thickness of the polysilicon layer.

It is to be noted that the method (doped polysilicon) introduced for formation of the polysilicon layer is preferable for introduction of impurity elements.

Figure 4C:
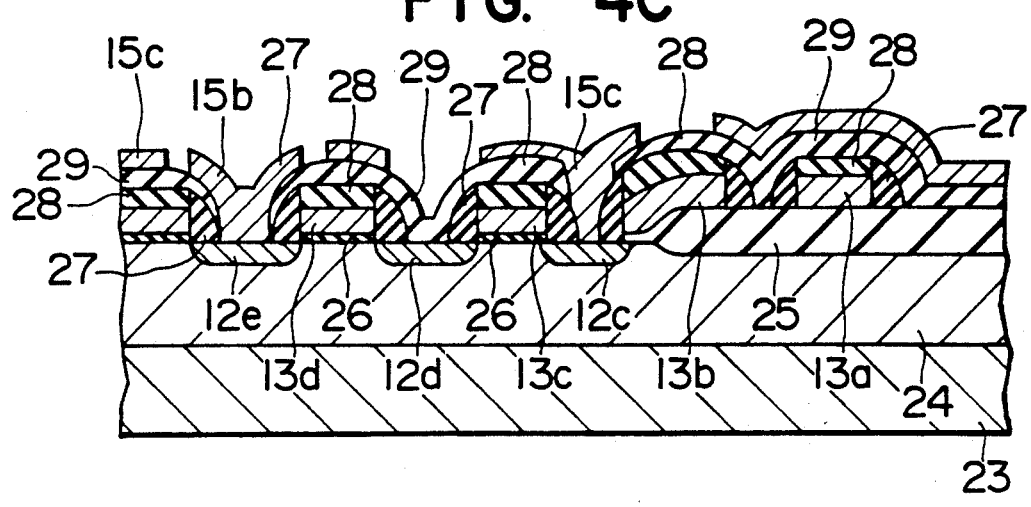

Polysilicon is used as the material of the ground electrode in the present embodiment but more preferably, a composite film (polycide film) having a compound (silicide: $WSi_2$, $MoSi_2$, $TiSi_2$ or $TaSi_2$) of such a refractory metal as tungsten, molybdenum, titanium or tantalum and silicon and a polysilicon layer may be used to reduce the electrode resistance (FIG. 4C).

Subsequently, a silicon nitride layer 30 is deposited to about 20 nm thickness through the LPCVD process and a contact hole (16b in FIG. 1A) is opened, though not depicted in the sectional view, through the silicon oxide layer 29 and silicon nitride layer 30 on the highly concentrated n-type impurity region 12d.

At that time, because of the provision of the spacer insulation layers 27 surrounding the side walls of the gate electrodes 13c and 13d and the overlying insulation layer 28, the gate electrodes 13c and 13d 10 can be insulated from the contact hole 16b by self-aligned technique when the dry etching conditions are properly set.

Subsequently, a contact hole (17a in FIG. 1A) is opened through the insulation layer 28, silicon 29 and silicon nitride layer 30 in register with the gate electrode 13b by using photolithography and dry etching method.

Figure 4D:
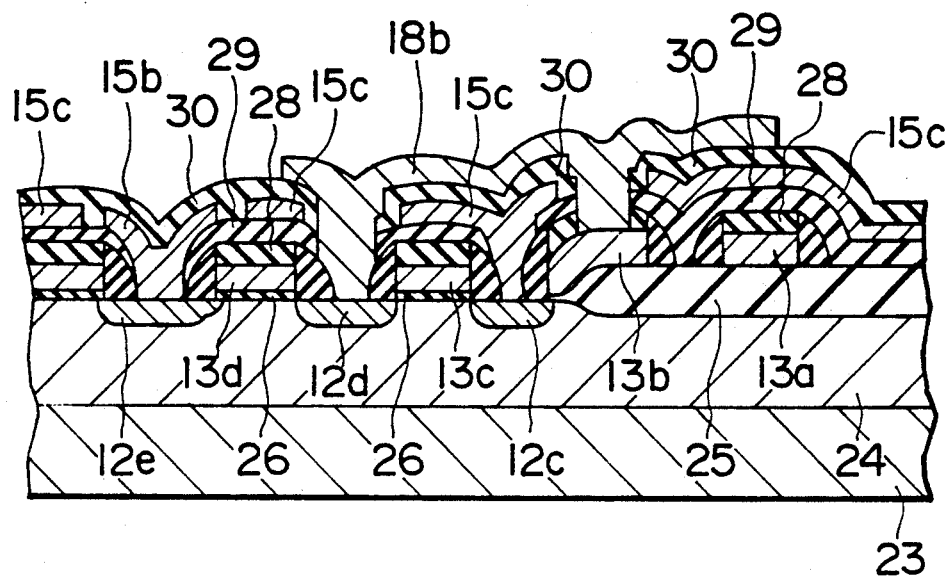

A third polysilicon layer 18b is deposited to about 50 nm thickness through the LPCVD process and then an n-type impurity is added to the third polysilicon layer 18b by ion implantation of arsenic carried out at, for example, 80 keV and $5 \times 10^{15}$ cm$^{-2}$. The resulting structure is activated through a predetermined annealing process and is then processed to a desired shape (FIG. 4D).

In addition, a silicon oxide layer serving as an insulation layer 31 is deposited to about 5 to 50 nm thickness through the LPCVD process and the deposited layer is annealed at 850° to 900° C. for about 10 minutes in ambient atmosphere of nitrogen to form a gate insulation layer 31 for the polysilicon PMOS transistors.

Conveniently, with the aim of improving driving capability of polysilicon PMOS transistors, the SiO2 insulation layer may be reduced in thickness effectively and may have a higher dielectric constant by being replaced with an insulation layer which is formed of a silicon nitride (Si3N4) layer, made of oxynitride (SiON) or formed of a two-layer film of a silicon nitride layer and a silicon oxide layer.

Then, contact holes 19a and 19b shown in FIG. 1B are opened through the insulation layer 31 by using photolithography and dry etching.

Thereafter, a fourth polysilicaon layer is deposited through the LPCVD process to form polysilicon layers 20a, 20d and 20e having a thickness of 10 to 50 nm.

Subsequently, the fourth polysilicon layer is processed into a desired shape by using photolithography and dry etching and a silicon oxide layer having a thickness of, for example, 5 nm is formed on the polysilicon layers 20a, 20d and 20e through the LPCVD process.

Thereafter, source region 20e and drain region 20a of polysilicon PMOS transistors are formed using a photo-mask for ion implantation.

Figure 4E:
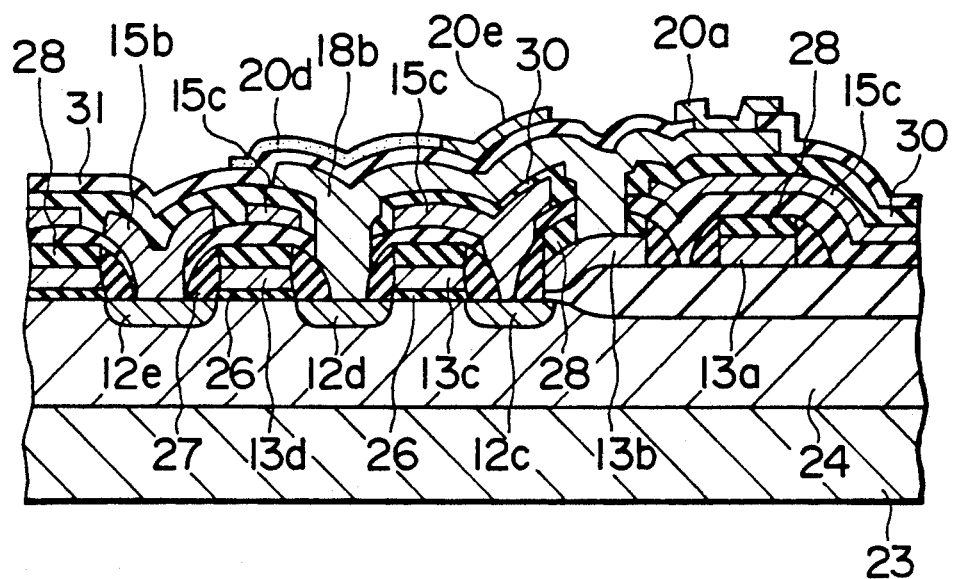
Figure 4F:
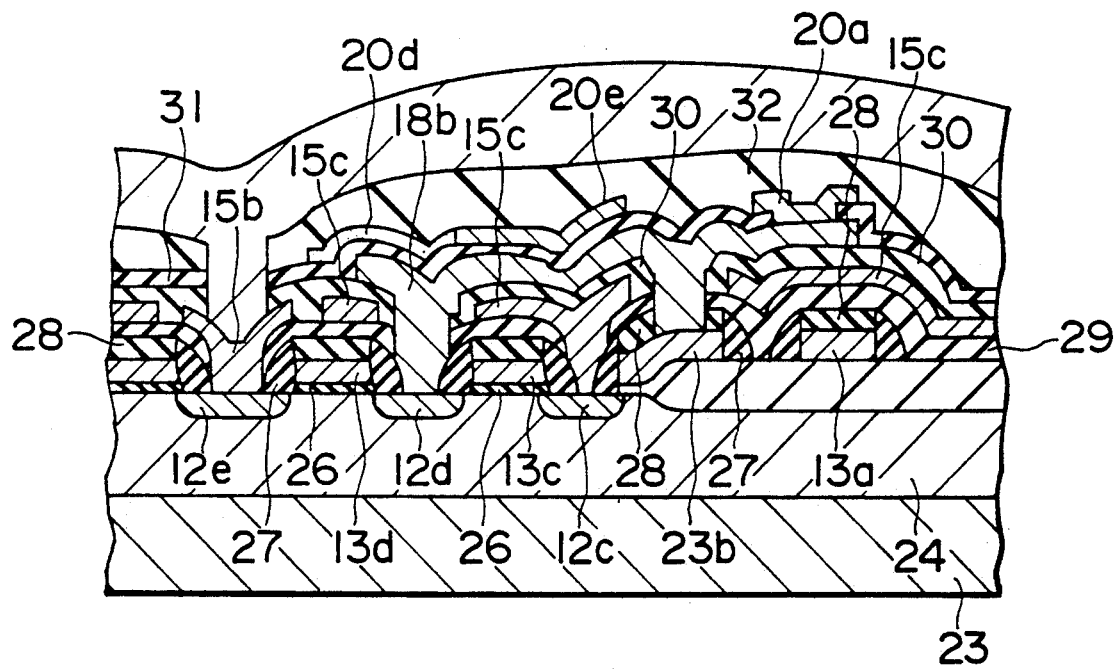

Ion implantation suited for formation of the source and drain regions is $BF_2$ ion implantation carried out under the condition of, for example, an energy level of 25 keV and an implantation amount of $10^{14}$ to $10^{15}$ cm$^{-2}$ (FIG. 4E).

It should be appreciated that in a sectional view of FIG. 4E the source and drain regions possessed by the same polysilicon PMOS transistor are not depicted but the source region 20e of one polysilicon PMOS transistor and the drain region 20a of the other polysilicon PMOS transistor are depicted.

Subsequently, a composite silicon oxide film 32 having a silicon oxide layer of a thickness of, for example, 100 nm and an oxide layer made of, for example, boron-phosphosilicate glass (BPSG) and having a thickness of, for example, 300 nm is deposited and the deposited film undergoes predetermined annealing to cause the boron phosphorus glass to reflow, thus relieving stepped portions present in the memory cell.

Thereafter, a contact hole 21b is opened, an aluminum electrode is deposited to about 0.9 $\mu$m by sputtering, and the deposited electrode is dry etched into a pattern of aluminum electrode 22b by using a photomask.

Conveniently, a material having good step coverage such as tungsten may be used as the electrode material.

In this case, the aluminum electrode formed as the second layer electrode may preferably be used as the data line sensitive to access delay.

Since according to the present embodiment the area of the electrode for standard voltage in the memory cell can be widened without increasing the memory cell area, parasitic capacitance parasitically formed between the gate electrodes of polysilicon PMOS transistor and the electrode for standard voltage supply in the memory cell can be increased.

This can make the memory cell immune to the upset of data or a so-called $\alpha$-ray soft error which takes place when $\alpha$-rays impinge upon the cell.

Further, since the PMOS transistor and NMOS transistor constituting the memory are shielded from each other by means of the ground electrode, noise-proof capability of the memory cell can be improved to permit the provision of a SRAM capable of operating even at a low voltage.

Embodiment 2

The present embodiment is directed to a method of reducing the area necessary for separation between the ground electrode and the contact pad in the SRAM cell of embodiment 1 by forming extremely small gaps through the use of a photo-mask having a phase shifter layer when patterning the second-layer conductive layer.

Figures 5A, 5B, 5C:
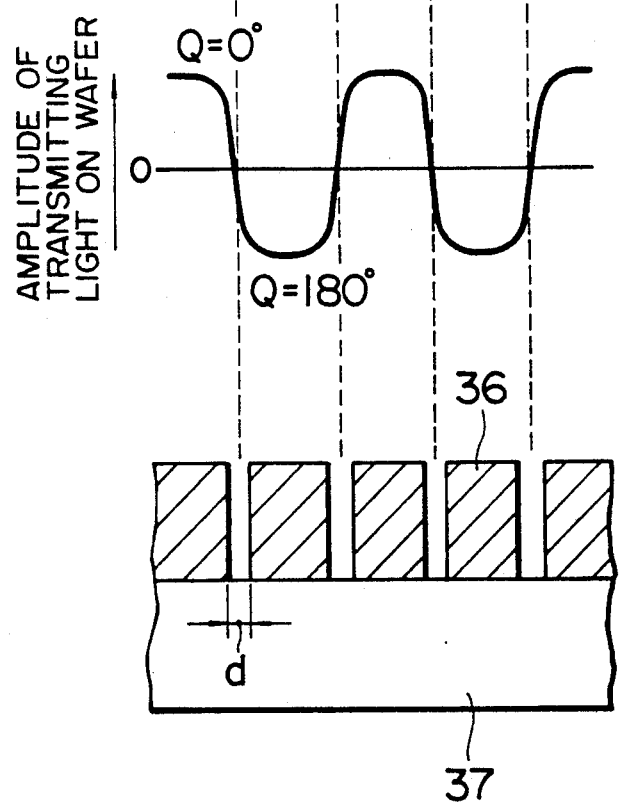
FIGS. 5A to 5C and FIGS. 6A to 6D are diagrams useful to explain the principle of a second embodiment of the invention.

FIGS. 5A to 5C and FIGS. 6A and 6B show the principle of formation of a phase shifter mask and extremely small gaps in accordance with the present embodiment, with FIG. 5A showing a sectional view of the phase shifter mask and transmitting light, FIG. 5B showing the amplitude of transmitting light containing information of phase on the silicon wafer and FIG. 5C showing a sectional view of a photoresist.

Figure 6A:
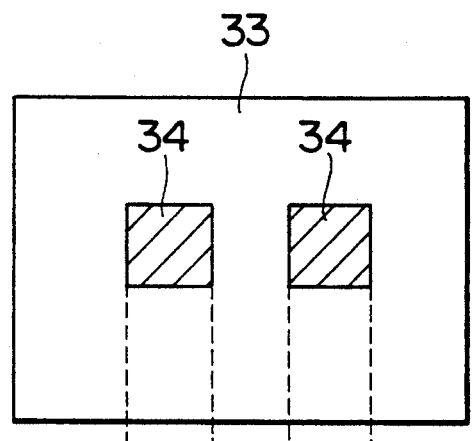
Figure 6B:
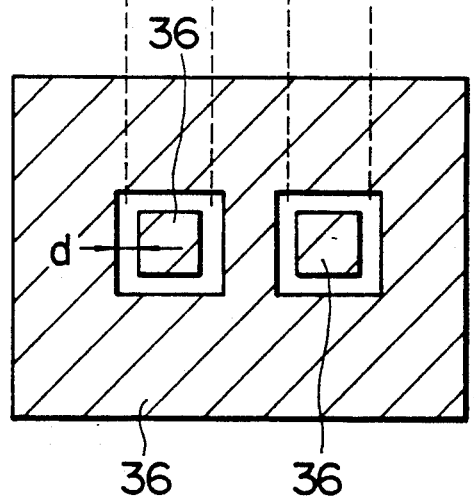

FIG. 6A is a plan view of the phase shifter mask and FIG. 6B shows a planar configuration of the photoresist.

As shown in FIG. 5A, phase shifter layers 34 for 180-degree inversion of the phase of transmitting light are disposed at a plurality of locations on a glass substrate 33 constituting a photo-mask.

Projecting light 35 for exposing the photoresist transmits through both of a portion where the shifter layer exists and a portion where the shifter layer does not exist.

Accordingly, the phase of projecting light 35 transmitting through the portion where the shifter layer 34 is present is 180 degrees shifted relative to the phase of projecting light transmitting through the portion where the shifter layer is nonexistent.

To meet the above condition, the thickness, d, of the shifter layer is so selected as to satisfy equation (1)

$$d = \lambda/2(n-1) \qquad (1)$$

where $\lambda$ is wavelength of projecting light and n is refractive index.

Under the above condition, the end or edge of the phase shifter layer 34 behaves as a transition region for phase inversion of transmitting light and consequently the intensity of projecting light transmitting through this region is completely zeroed as shown in FIG. 5B.

Accordingly, when a pattern-transferred photoresist 36 is of a negative resist, the resist is formed with extremely small gaps of 0.1 to 0.4 $\mu$m as shown in FIG. 5C.

FIG. 6A shows a planar configuration of the photo-mask in which a plurality of phase shifter layers 34 are disposed on the glass substrate in island pattern.

The photoresist pattern-transferred by using this photo-mask has a pattern 36 in which a ring-like gap d measuring 0.1 to 0.4 $\mu$m is formed.

Conveniently, the shifter layer may be of a silicon oxide layer formed by rotary spraying.

The shifter layer is disposed in island pattern in FIG. 6A but the principle of the present embodiment can be valid for a different pattern configuration, that is, a hole pattern in which the other portion than the shifter layer 34 shown in FIG. 6A behaves as a shifter layer.

Figure 6C:
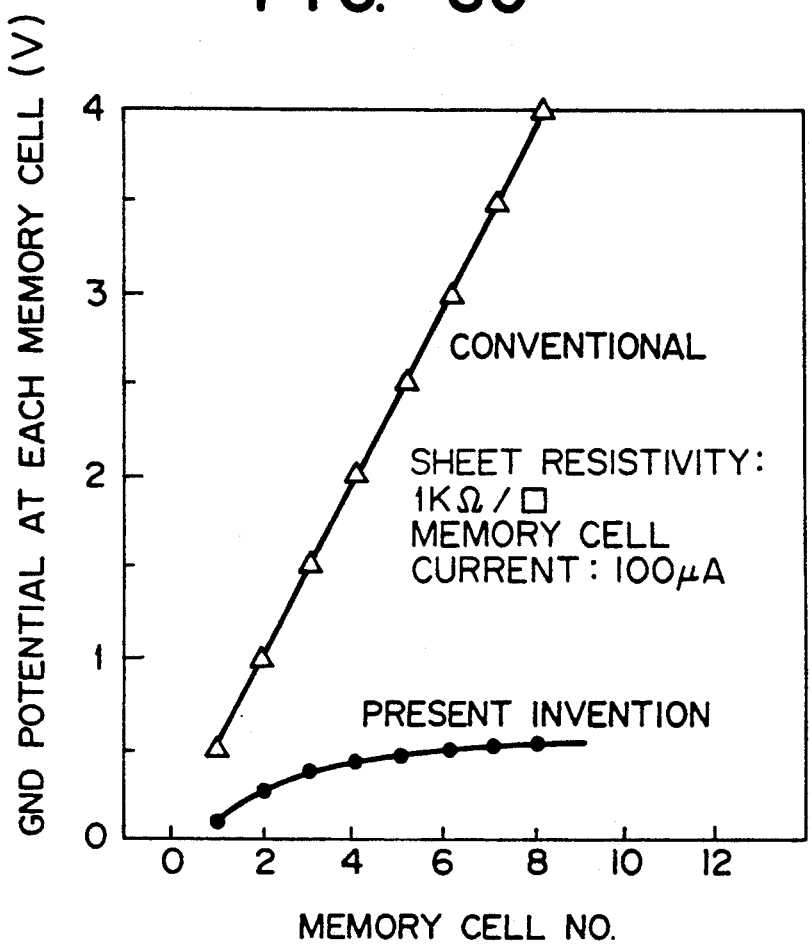
Figure 6D:
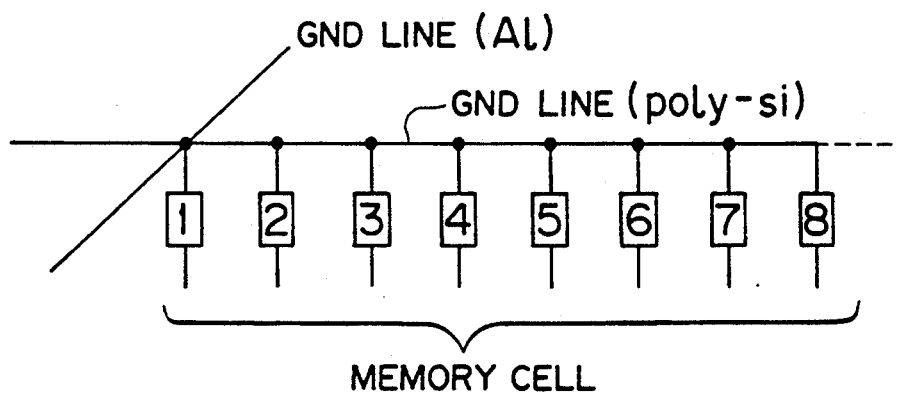

In accordance with the present embodiment, an increase in grounded potential supplied to the memory cells connected to the common ground electrode as shown in FIG. 6D can be suppressed to a great extent as compared to that in the prior art as shown in FIG. 6C, thus permitting the provision of a SRAM capable of stably operating even at a low power supply voltage.

In the present embodiment, the second-layer conductive layer is a polysilicon layer but a compound (silicide) of such a refractory metal as tungsten silicide layer or titanium silicide layer and silicon or a composite film (polycide) of a silicide layer and a polysilicon layer has by itself a lower resistance and is more preferable.

Embodiment 3

The present embodiment is directed to a method for insulation separation between the second-layer conductive layer and the third-layer conductive layer in the SRAM cell according to embodiment 1.

FIGS. 7A to 7F show a SRAM cell according to the present embodiment, especially illustrating in sectional form the neighborhood of the juction between the third-layer polysilicon layer 18a and highly concentrated n-type impurity region 12d shown in FIGS. 1A and 1B in sequence of step of the fabrication process.

The present embodiment will now be described with reference to FIGS. 7A to 7F.

Steps for formation of n-channel MOS transistors and the ground electrode on the n-type silicon substrate 23 are identical to steps shown in FIGS. 4A to 4C described in connection with embodiment 1 with the only exception that the ground electrode, that is, the second-layer polysilicon layer has a different pattern configuration.

A silicon nitride layer 30 is deposited through the LPCVD process on the resulting structure obtained through the above steps.

Figure 7A:
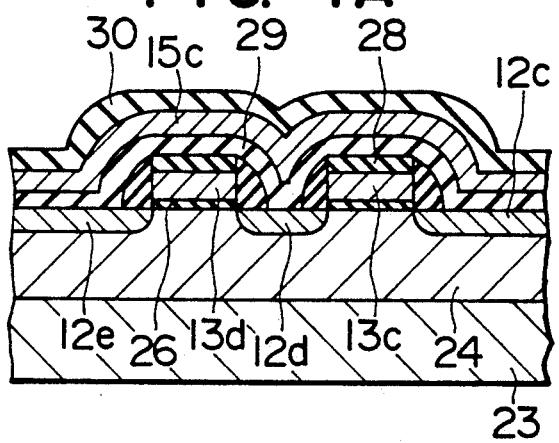
FIGS. 7A to 7F are sectional views showing the fabrication process of a third embodiment of the invention in sequence of steps.

Conveniently, the deposited silicon nitride layer 30 has a thickness of 30 to 100 nm in consideration of its thickness expected to be reduced in a succeeding step (FIG. 7A).

Figure 7B:
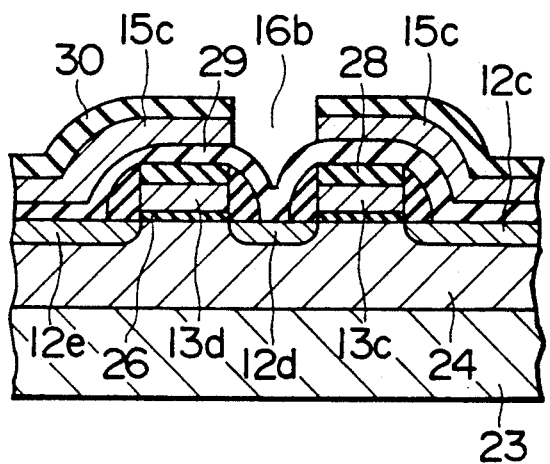

Subsequently, a contact hole 16b is opened through the silicon nitride layer 30 and the second-layer polysilicon layer 15c in register with the highly concentrated n-type impurity region 12d by using the same photo-mask through photolithography process and dry etching (FIG. 7B).

Thereafter, the second-layer polysilicon layer 15c exposed to the side wall of the contact hole 16b is side-etched using etchant exhibiting an etching rate which is 20 times or more higher for etching polysilicon such as hydrazine or mixed solution with hydrofluoric acid and nitric acid than for etching silicon oxide layer and silicon nitride layer.

Figure 7C:
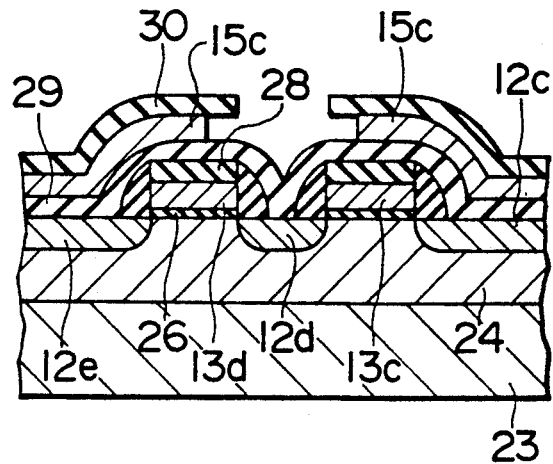

Since the highly concentrated n-type impurity region 12d in the silicon substrate is covered with the overlying silicon oxide layer 29, the silicon substrate will not be etched during the side etching step (FIG. 7C).

Figure 7D:
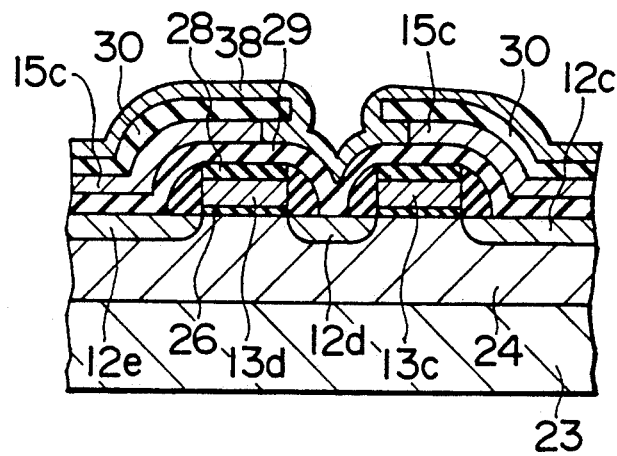

Subsequently, a silicon oxide layer 38 is deposited to, for example, 50 nm thickness through the LPCVD process so as to be embedded in the void formed by side etching previously conducted (FIG. 7D).

Further, the silicon oxide layer 38 is etched using anisotropic dry etching such as reactive ion etching to form a spacer insulation layer on the side wall or rim of the contact hole 16b.

Figure 7E:
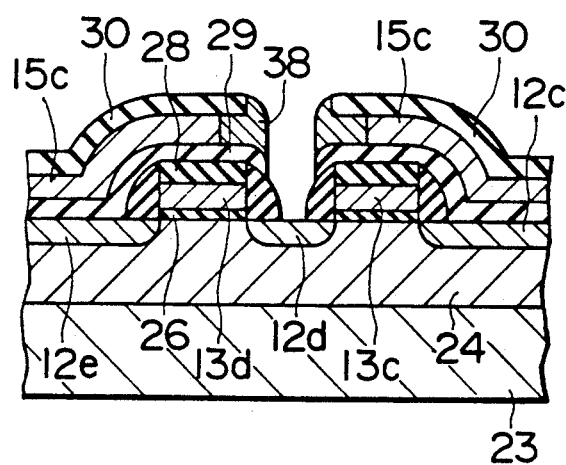
Figure 7F:
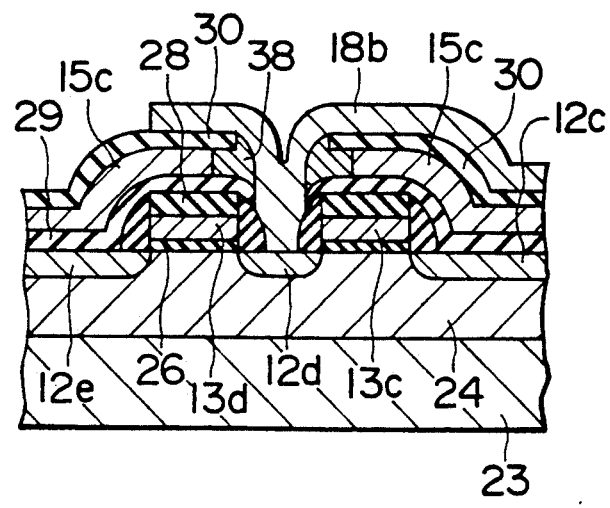

The dry etching is so conditioned that the silicon oxide layer 29 at the bottom of the contact hole 16b is also etched away (FIG. 7E).

Step for formation of the third-layer polysilicon layer (FIG. 7F) and ensuing steps are identical to those in embodiment 1.

In accordance with the present embodiment, the second-layer polysilicon layer serving as the ground electrode is insulated from the third-layer polysilicon layer serving as the gate electrode of polysilicon PMOS transistor and the cross-connection electrode by self-aligned technique.

Accordingly, the effective width of the ground electrode 15C can be widened without increasing the memory cell area and the above two kinds of conductive layers can be prevented from being short-circuited owing to mis-register of the photo-mask.

Embodiment 4

The present embodiment is directed to facilitation of the step for opening the contact hole in embodiment 3.

Figure 8A:
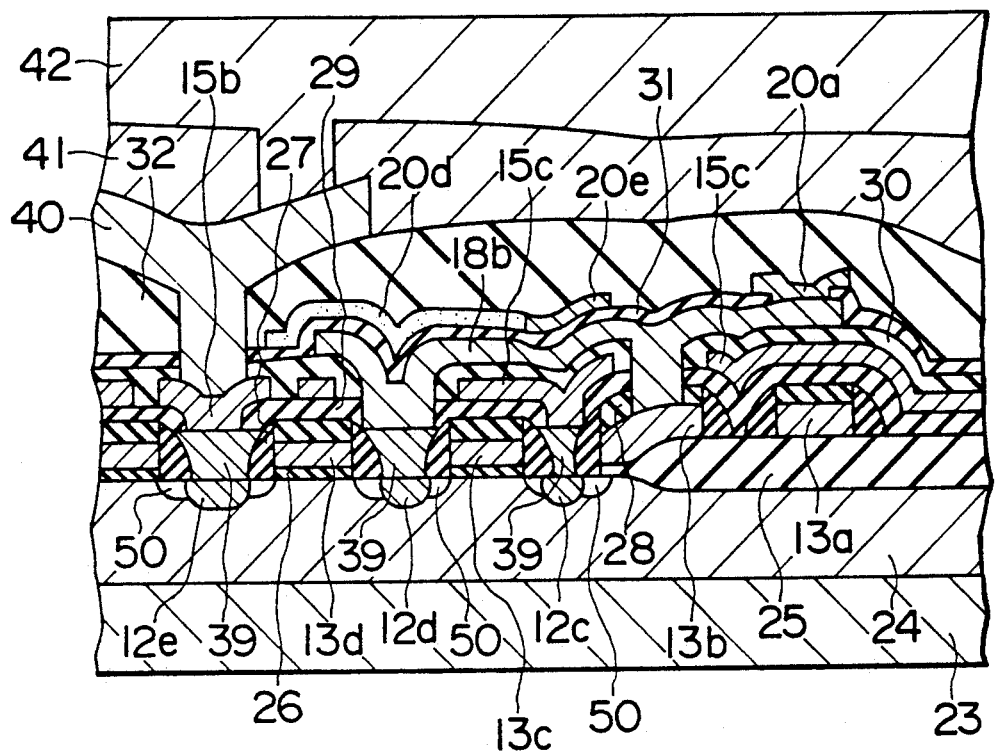
FIGS. 8A and 8B are sectional views showing a fourth embodiment of the invention.

FIG. 8A is a sectional structural view of an SRAM cell according to the present embodiment.

Referring to FIG. 8A, polysilicon layers 39 added with highly concentrated n-type impurity are selectively embedded in voids surrounded by spacer insulation layers 27 for gate electrodes 13b, 13c and 13d and being in register with all of the highly concentrated n-type impurity regions 12c, 12d and 12e included in the memory cell.

Conductive layers 15b, 15c of a second layer and a conductive layer 18b of a third layer are connected to the selectively formed polysilicon layers 39 overlying the silicon substrate and the connected to the highly concentrated n-type impurity regions 12c, 2d and 12e.

For selectively formation of the polysilicon layers 39, polysilicon selective growth technique may be used.

Alternatively, a polysilicon layer may be deposited to about 500 nm thickness and etch-backed by about 300 nm, polysilicon may be embedded in a gate electrode space, and a desired portion may be trimmed by using photolithography and dry etching.

In the present embodiment, the data line is formed at the aluminum electrode of the second-layer electrode to permit the provision of a high-speed SRAM.

Further, in the present embodiment, a so-called LDD (Lightly Doped Drain) structure having a low concentrated n-type impurity region 50 is used for the source and drain of MOS transistor to prevent the MOS transistor from being degraded in reliability during long-term use thereof.

Figure 8B:
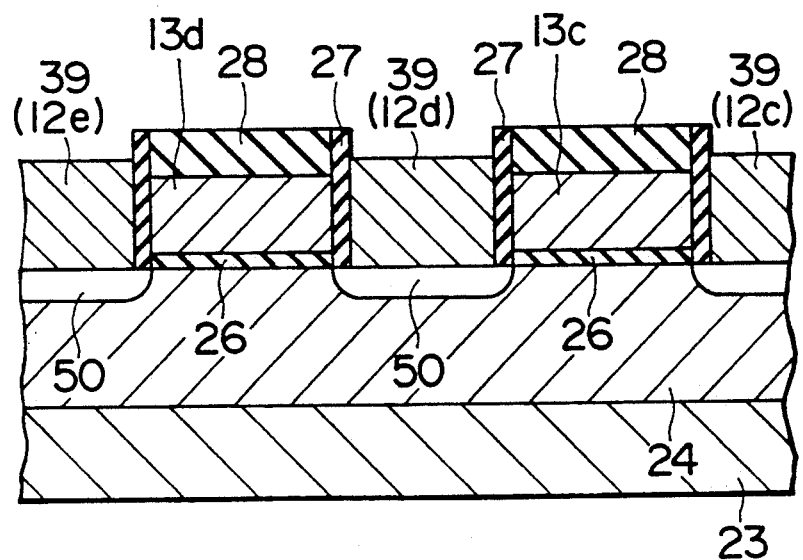

The present embodiment may be modified as shown in FIG. 8B such that the highly concentrated n-type impurity regions 12c, 12d and 12e are formed in the selectively formed polysilicon layers 39 and only the low concentrated n-type regions 50 are formed in the p-type well 24.

In FIG. 8B, only a portion of the memory cell where the transfer MOS transistor and driver MOS transistor are formed is illustrated.

By forming the source and drain regions above the major surface of the silicon substrate, a highly integrated SRAM having high hot-carrier-proof capability can be realized even with a spacer insulation layer 27 reduced in spacer length.

Obviously, the embodiment of FIG. 8B may be used for the peripheral circuit of memory to attain advantages that the planar area of the p-n junction forming the source and drain of MOS transistor of the peripheral circuit can be reduced to decrease parasitic junction capacitance associated with the source and drain, thus providing a semiconductor memory device capable of operating at high speeds.

In accordance with the present embodiment, a fault that the effective thickness of a layer to be etched at the gate electrode stepped portion is increased to cause defective conduction in the layer etched to open the contact hole 16b therethrough can be prevented to improve the production yield of highly integrated SRAM's.

Embodiment 5

In the method for production of the polysilicon PMOS transistor according to embodiment 1, the present embodiment is directed to a structure for prevention of degradation of gate breakdown voltage and its fabrication process.

Figure 9A:
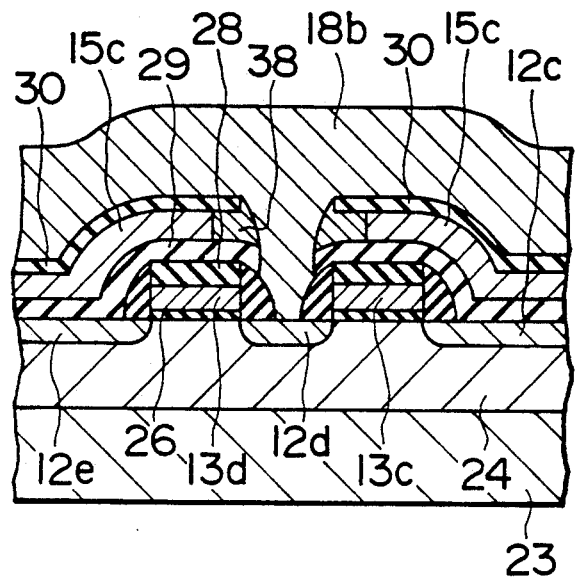
FIGS. 9A and 9B are sectional views showing the fabrication process of a fifth embodiment of the invention in sequence of steps.
Figure 9B:
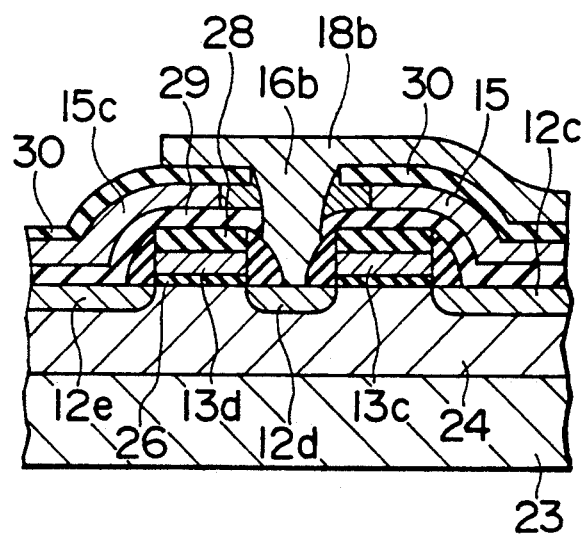

FIGS. 9A and 9B show a SRAM cell according to the present embodiment, especially illustrating in sectional form the neighborhood of the junction between the third-layer polysilicon layer 18b and highly concentrated n-type impurity region 12d shown in FIGS. 1A and 1B in sequence of step of the fabrication process.

Referring to FIGS. 9A and 9B, a third-layer polysilicon layer 18b is deposited to, for example, about 300 nm (FIG. 9A).

Subsequently, the polysilicon layer 18b is etch-backed to about 100 nm thickness by using anisotropic reactive ion etching and the layer 18b embedded in a contact hole 16b is flattened.

Thereafter, as in embodiment 1, the polysilicon layer 18b is added with impurity ions and processed into a desired pattern of the gate electrode by using photolithography and dry etching (FIG. 9B).

In accordance with the present embodiment, the channel portion of polysilicon PMOS transistor in register with the contact hole 16b can be formed on the flattened gate electrode and therefore the problem of the degradation of gate breakdown voltage at a stepped portion can be eliminated.

Embodiment 6

The present embodiment is directed to an application of the SRAM according to the invention to an IC card having a memory capacity of 4 Mbits or more.

Figure 10:
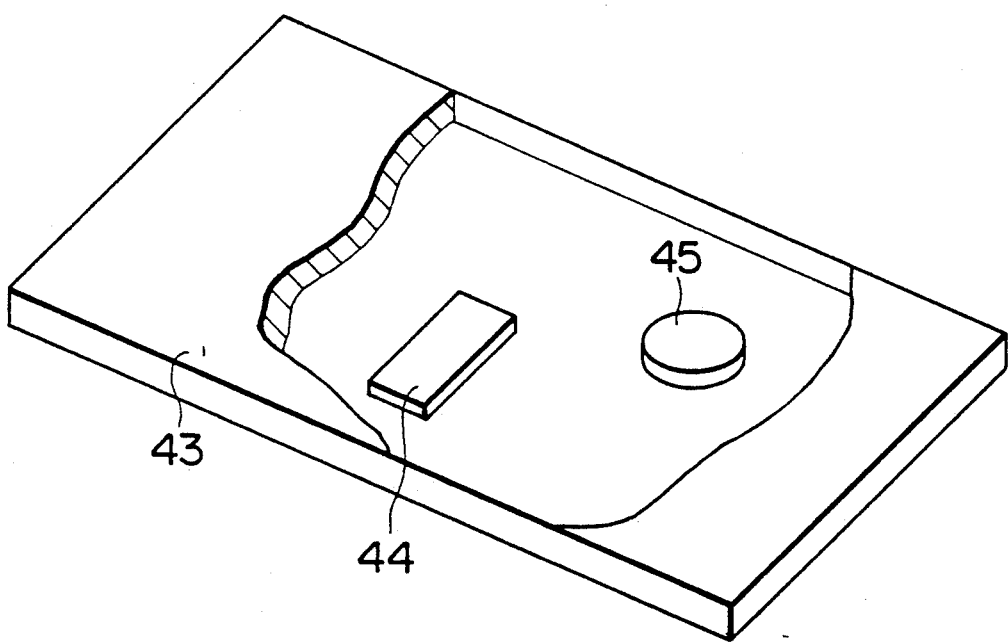
FIG. 10 is a perspective view showing a sixth embodiment of the invention.

FIG. 10 shows part of the interior of an IC memory card according to the present embodiment.

Referring to FIG. 10, the IC card 43 comprises an SRAM chip 44 of large capacity according to the invention, a battery 45 for memory data storage capable of supplying a power supply voltage of 1 to 1.5 V, an I/O interface chip for data input and output, a decoder chip for address control of the interface chip, and connectors for connection to external units.

As the battery 45 for data storage, a single battery of small size and large current capacity such as a lithium battery is carried in the card and used to store data within the SRAM chip of ultra-low power consumption.

The SRAM chip can be operated to store data even with a power supply voltage of 1 V or less and the battery 45 for data storage supplies a low voltage of 1 V or less.

However, the SRAM chip 44 illustrated herein is of a large capacity and therefore one or two batteries may otherwise be carried in.

The SRAM chip according to the present embodiment can be operated at a low voltage of 1 to 1.5 V and it can be connected, for use, to a handy type portable device (for example, electronic notebook) which operates with a battery of 1 to 1.5 V. The battery for storage of data of the IC card can be of 1 V or less and reduction in size and weight of IC card can be attained.

Embodiment 7

The present embodiment is directed to the use of a phase shifter mask for patterning the gate electrode of polysilicon PMOS transistor in the SRAM cell according to embodiment 1.

Figure 11A:
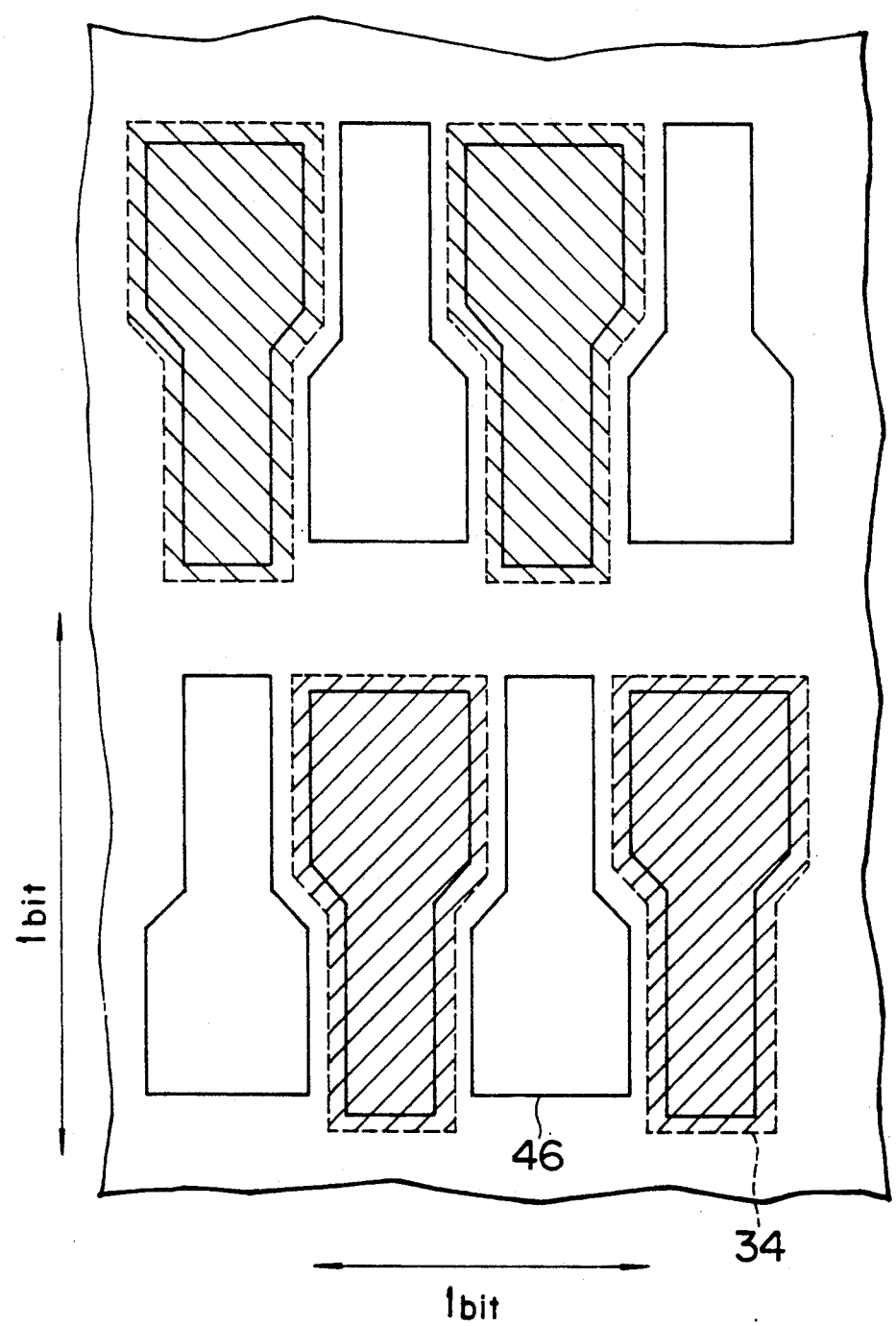
FIGS. 11A and 11B are plan views showing a seventh embodiment of the invention.

FIG. 11A is a plan view of a phase shifter mask used for patterning the third-layer polysilicon layer in embodiment 1, that is, the gate electrode of PMOS transistor.

Referring to FIG. 11A, mask apertures 46 adjacent in either X or Y direction are so designed as to be closely spaced apart from each other by a distance of about 0.1 to 0.2 μm when the mask is placed on an actual device, and mask apertures 46 are alternately applied with phase shifter layers 34.

In accordance with the present embodiment, when a pattern of a large area is required as in the case of the gate electrode of polysilicaon PMOS transistor, a fine gap can be formed by avoiding mutual contact of adjacent patterns to improve the degree of . integration of SRAM cell and besides improve the production yield.

In the present embodiment, the phase shifter mask is exemplarily applied to formation of the gate electrode of polysilicon PMOS transistor but it may be applicable to another layer in which adjacent patterns are closely spaced apart from each other.

Further, teachings of the present embodiment can be applied to memory LSI's such as DRAM, EPROM, EEPROM and mask ROM.

Figure 11B:
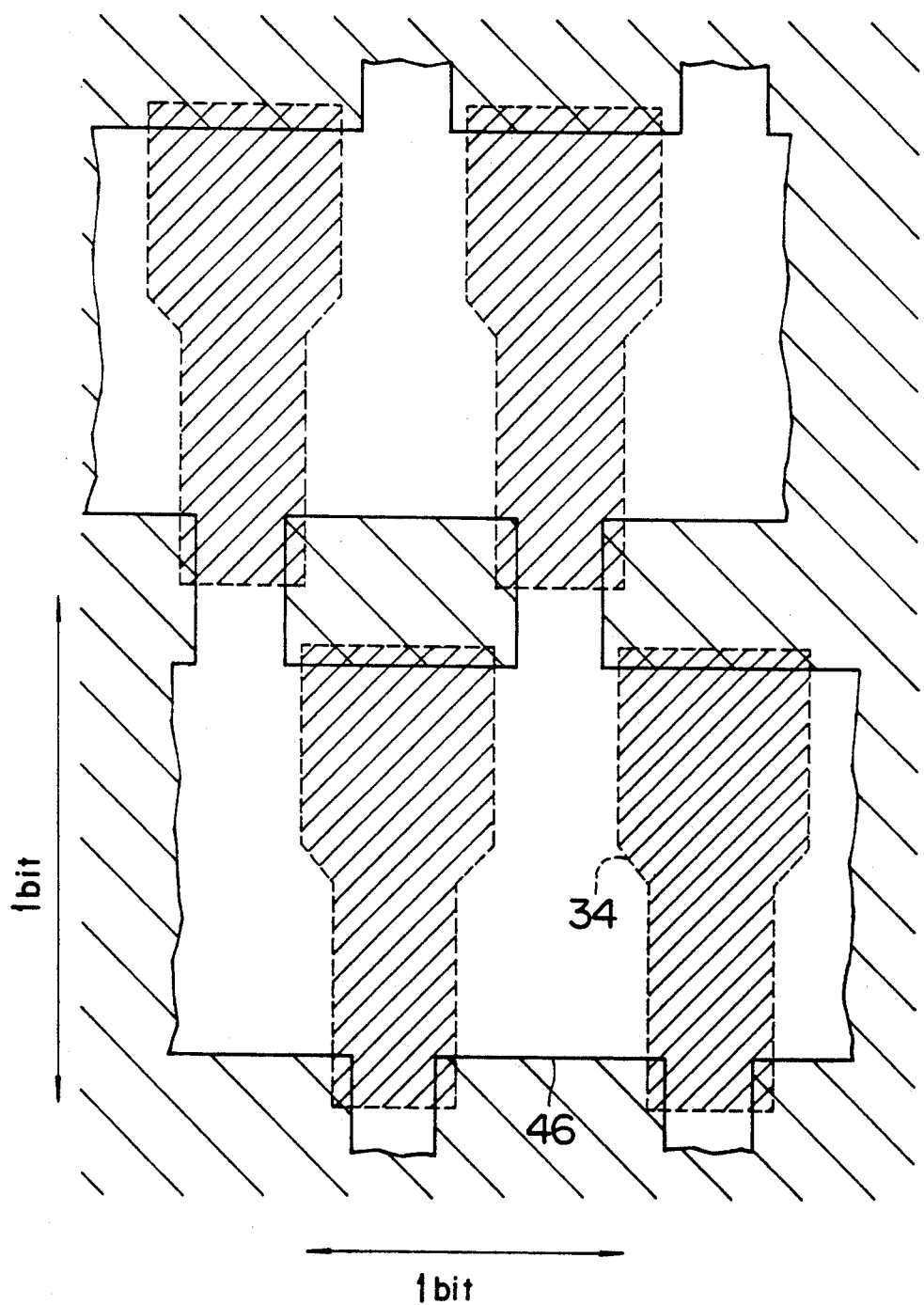

FIG. 11B shows a different method from that described with reference to FIG. 11A of using the phase shifter mask in patterning the gate electrode of PMOS transistor.

In FIG. 11B, a plurality of phase shifter masks 34 are applied to one mask aperture 46 of a photo-mask. Pursuant to the principle described in connection with embodiment 2, the intensity of transmitting light is substantially zeroed at the end or edge of the phase shifter layer 34. Accordingly, an extremely small gap can be formed along the contour of the phase shifter layer 34 within the mask aperture 46 to improve the density of integration of the memory cell. While in the present embodiment a plurality of phase shifter layers 34 are applied to one mask aperture of the photo-mask, a phase shifter layer having a plurality of openings may also be used.

Embodiment 8

The present embodiment is directed to the use of a phase shifter mask in processing the gate electrode of the SRAM cell according to embodiment 1.

Figure 12A:
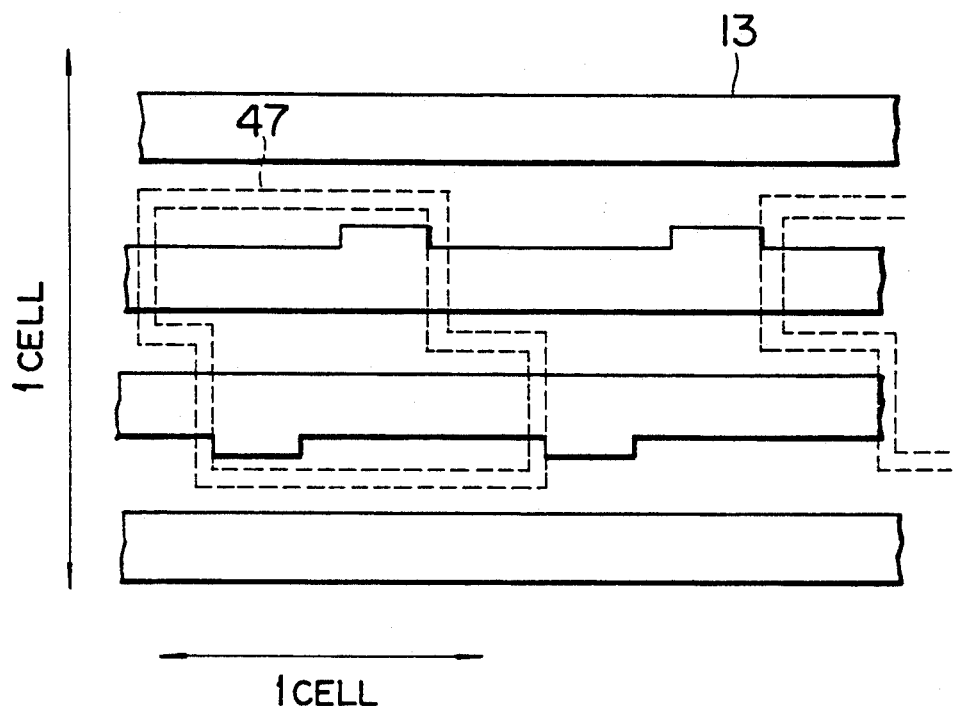
FIGS. 12A and 12B are plan views showing an eighth embodiment of the invention.
Figure 12B:
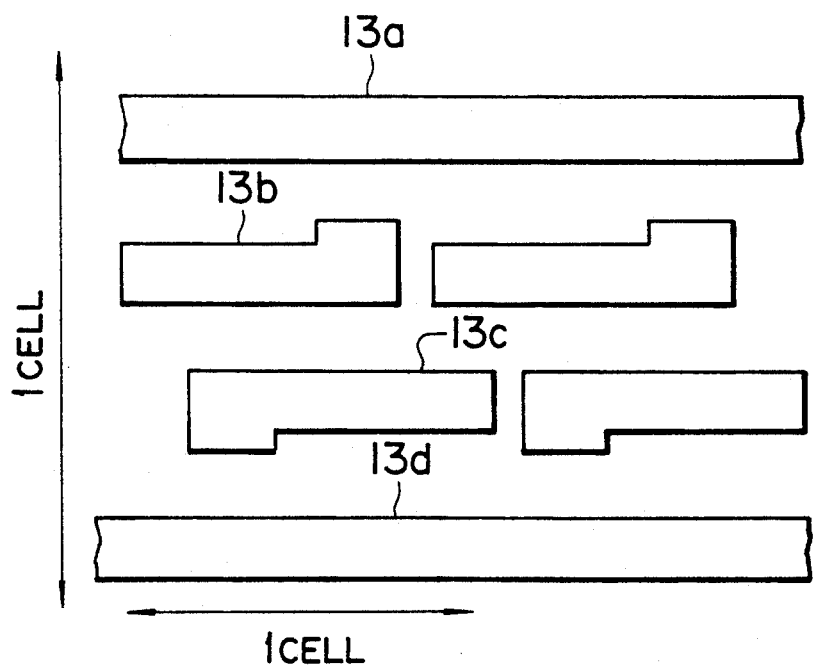

FIGS. 12A and 12B are plan views showing the fabrication process of the present embodiment.

Referring to FIGS. 12A and 12B, the gate electrode 13 of the MOS transistor formed in the silicon substrate is first processed into a line and space pattern by using ordinary photolithography and dry etching as described in connection with embodiment 1 (FIG. 12A).

For the above process of gate electrode, a phase shifter mask may also be used.

Subsequently, by anisotropic dry etching using a phase shifter mask which can form the extremely small gap 47 in the resist by the aid of its shifter layer alone as described in connection with embodiment 1, adjacent electrode pattern elements are cut and processed into a desired gate electrode configuration to provide gate electrodes 13 of adjacent cells (FIG. 12B). The phase shifter mask is designed such that the edge of the phase shifter layer can lie in an area between two dotted lines defining an extremely small gap 47 as shown in FIG. 12A.

In accordance with the present embodiment, the gap between adjacent memory cells can be reduced and therefore a highly integrated SRAM can be provided.

Embodiment 9

The present embodiment is directed to a solution for problems encountered in the fabrication method using the phase shifter mask.

Figure 13A:
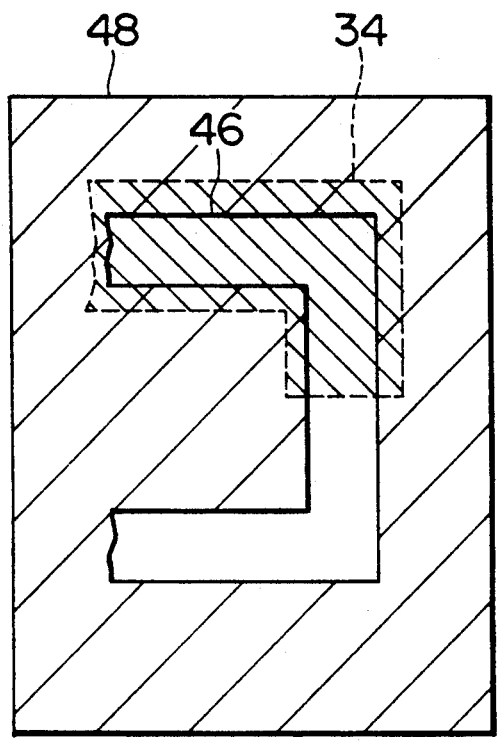
FIGS. 13A to 13C are plan views showing a ninth embodiment of the invention.
Figure 13B:
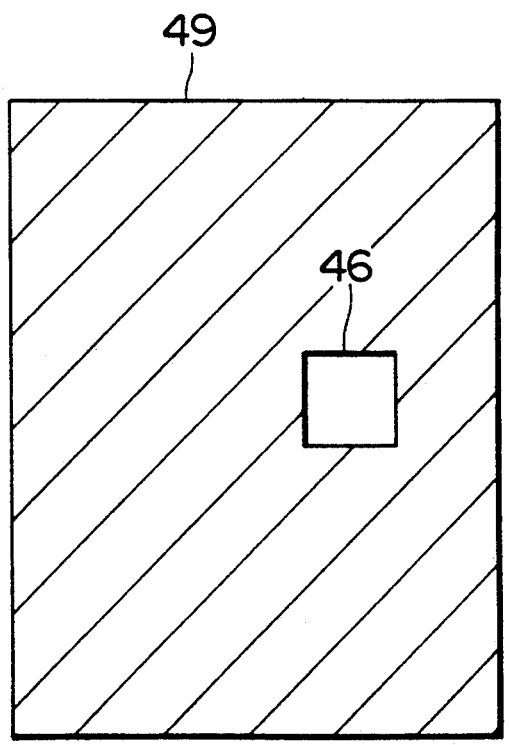
Figure 13C:
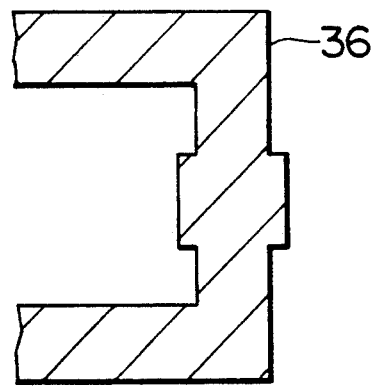

FIGS. 13A and 13B show a phase shifter mask and a conventionally structured photo-mask, respectively, and FIG. 13C shows a desired resist pattern.

In particular, illustrated in FIG. 13A is a mask 48 having a phase shifter layer (hatched portion in the drawing) used for patterning the gate electrode also serving as the word line.

A mask aperture 46 corresponds to, for example, a peripheral circuit at an end of the memory array.

In FIG. 13A, a part of word line applied with a shifter layer 34 is connected with a part of word line not applied with the shifter layer. Pursuant to the principle described in connection with embodiment 2, the intensity of transmitting light is zeroed at the juncture and the former and latter word line parts are cut and separated from each other at the juncture.

Then, immediately after completion of exposure using the phase shifter mask 48, superimposed exposure is carried out by using a photo-mask 49 having a mask aperture as shown in FIG. 13B.

As a result, a photoresist pattern as shown in FIG. 13C can be formed.

The present embodiment has been described as being applied to processing the gate electrode but obviously the invention may also be applicable to other LSI's produced using similar electrode layer and phase shifter mask.

In accordance with the present embodiment, problems encountered in the fabrication process using the phase shifter mask can be solved by slightly increasing the number of fabrication steps and a SRAM of ultra-high integration can be provided.

Embodiment 10

Figure 14:
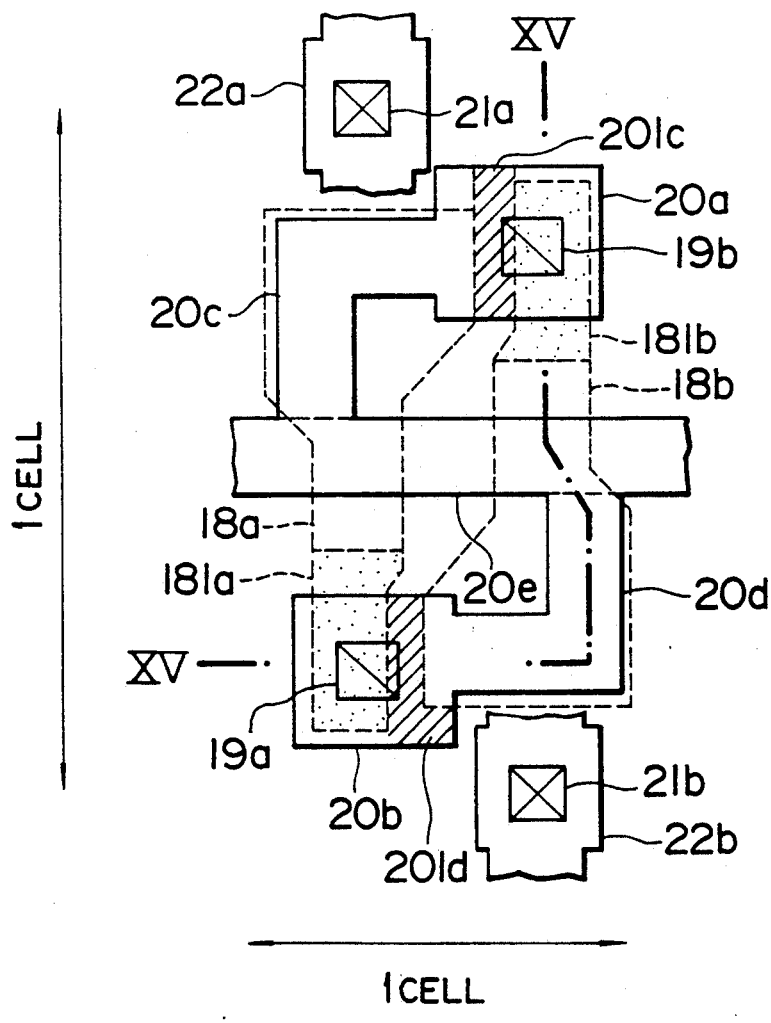
FIG. 14 is a plan view showing a tenth embodiment of the invention.
Figure 15:
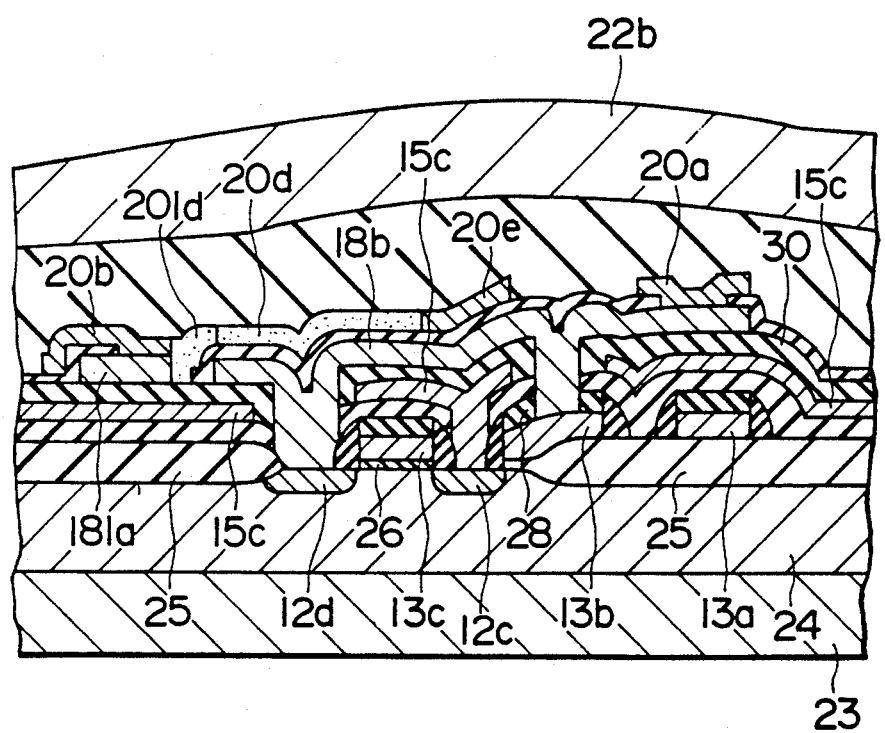
FIG. 15 is a sectional view showing the tenth embodiment of the invention.

The present embodiment is directed to automatic formation of a highly resistive drain region provided for the drain region of polysilicon PMOS transistor of the SRAM cell according to embodiment 1. FIG. 14 is a plan view showing a data line portion of polysilicon PMOS transistor according to the present embodiment and the remaining portion of the memory cell is identical to that in FIG. 1A. FIG. 15 is a sectional view taken along the line XV—XV of FIG. 14. Referring to FIGS. 14 and 15, a drain region 181a of polysilicon PMOS transistor is formed in a third-layer polysilicon layer at least part of which is added with such a p-type impurity as boron by $10^{19}$ cm$^{-3}$ or more and a gate electrode 18b of the polysilicon PMOS transistor is also formed in the same third-layer polysilicon layer as the drain region. A channel region 20d of the polysilicon PMOS transistor is formed in a fourth-layer polysilicon layer, extending until the drain region 181a in the third-layer polysilicon layer and is electrically connected to the drain region 181a formed of the third-layer polysilicon layer through a contact hole 19a so opened as to be contiguous to the end of the drain region 181a. Accordingly, the channel region 20d of the polysilicon PMOS transistor connects to a highly resistive drain region 201a formed of the fourth-layer polysilicon layer.

In accordance with the present embodiment, since the highly resistive drain region 201d is formed between the channel and drain regions of the polysilicon PMOS transistor, electric field at the end of the drain which causes leakage current to flow through the source and drain of the polysilicon transistor can be relieved, thereby reducing leakage current of the polysilicon PMOS transistor and permitting the provision of a low power SRAM. Since in accordance with the present embodiment the length of the highly resistive drain region is determined by a distance between the gate electrode 18b and drain region 181a, resistance of the highly resistive drain region can be controlled accurately without being affected by mis-register of the photo-mask and leakage current can be reduced while making small a decrease in on-current of the polysilicon PMOS transistor. Obviously, if the third layer in the present embodiment is patterned using a phase shifter mask, then a finer highly resistive drain region 201d can be formed.

Preferably, an impurity of the same kind and the same amount as those of the impurity for the channel portion is introduced into the highly resistive drain region 201d.

An impuirity of opposite conductivity type may be introduced at a concentration of approximately $10^{17}$ to $cm^{-3}$. In this manner, drain current of polysilicon PMOS transistor can be prevented from being reduced.

Embodiment 11

Figure 16:
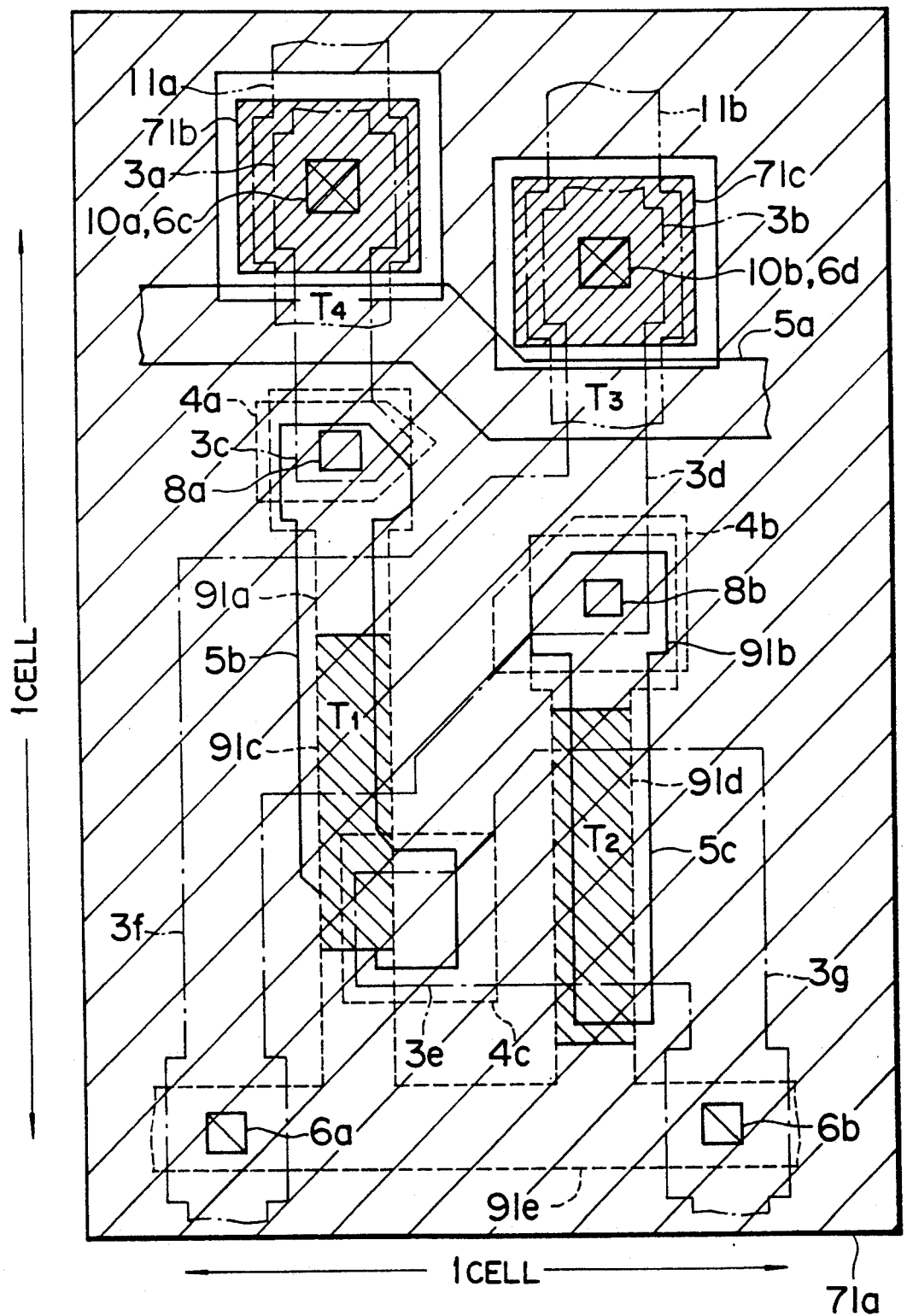
FIG. 16 is a plan view showing an eleventh embodiment of the invention.

The present embodiment is directed to a method for formation of the ground electrode of a SRAM cell using highly resistive polysilicon for the load element. Referring to FIG. 16 which is a plan view showing a SRAM cell according to the present embodiment, low resistive polysilicon layers 91a and 91e and low resistive polysilicon layers 91b and 91e are formed at opposite ends of each of a highly resistive polysilicon layer 91c and a highly resistive polysilicon layer 91d formed in a second-layer polysilicon layer, with the layers 91a and 91b connected respectively to highly concentrated n-type impurity regions 3c and 3d forming memory nodes of the memory cell through contact holes 8a and 8b and the opposite low resistive polysilicon layer 91e serving as a common power supply line within the memory. Further, contact holes 6a and 6b are opened through highly resistive n-type impurity regions 3f and 3g serving as the sources of the driver MOS transistors T1 and T2 included in the memory cell, and a third-layer polysilicon layer 71a serving as a common ground electrode is provided. Highly concentrated impurity regions 3a and 3b of the transfer MOS transistors are connected to third-layer polysilicon layers 71b and 71c through contact holes 6c and 6d to form contact pads. Contact holes 10a and 10b are opened through the third-layer polysilicon layers 71b and 71c and aluminum electrodes 11a and 11b are connected to the layers 71b and 71c.

In accordance with the present embodiment, the third-layer polysilicon layers 71b and 71c are spaced apart from the ground electrode 71a by a distance of 0.1 to 0.4 μm and therefore the area of the ground electrode of highly loaded SRAM cell can be increased to permit the ground electrode to have a small resistance. The highly resistive element is electrostatically shielded from the ground electrode by means of the upper aluminum electrode and therefore the influence of electric field upon the data line can be minimized to improve noise-proof capability.

In the present embodiment, the third-layer conductive layer is a polysilicon layer but a compund (silicide) of such a refractory metal as tungsten silicide layer or titanium silicide layer and silicon or a composite film (polycide) of a silicide layer and a polysilicon layer has by itself a lower resistance and is more preferable.

In accordance with the invention, in supplying grounded potential to the sources of driver MOS transistors within the memory cell, the grounded potential can be supplied stably to the memory cell even when a large current flows in the memory cell and a semiconductor memory device having a SRAM of ultra-high integration capable of operating at a low voltage can be provided.

It is further understood by those skilled in the art that the foregoing description is preferred embodiment of the disclosed device and that various changes and modifications may be made in the invention without departing from the spirit and scope thereof.

We claim:

1. A semiconductor memory device having a plurality of word lines, a plurality of complementary data line pairs each intersecting said plurality of word lines, and a plurality of memory cells provided at intersections of said plurality of word lines and said plurality of complementary data line pairs, each of said memory cells having a first and a second driver insulated gate field effect transistor of a first conductivity type, a first and a second load insulated gate field effect transistor of a second conductivity type different from the first conductivity type of said driver insulated gate field effect transistors, and a first and a second transfer insulated gate field effect transistor, said first and said second driver insulated gate field effect transistor and said first and said second transfer insulated gate field effect transistor being formed on a major surface of a semiconductor substrate, a gate of said first driver insulated gate field effect transistor and a gate of said first load insulated gate field effect transistor being coupled with a drain of said second driver insulated gate field effect transistor and a drain of said second load insulated gate field effect transistor, a gate of said second driver insulated gate field effect transistor and a gate of said second load insulated gate field effect transistor being coupled with a drain of said first driver insulated gate field effect transistor and a drain of said first load insulated gate field effect transistor so as to form complementary inverter circuits, thereby establishing a flip-flop circuit, said drain of said first driver insulated gate field effect transistor and said drain of said first load insulated gate field effect transistor being a first storage node of said flip-flop circuit, said drain of said second driver insulated gate field effect transistor and said drain of said second load insulated gate field effect transistor being a second storage node of said flip-flop circuit, said first storage node of said flip-flop circuit being coupled to a first line of said complementary data line pair via a source-drain path of said first transistor insulated gate field effect transistor, said second storage node of said flip-flop circuit being coupled to a second line of said complementary data line pair via a source-drain path of said second transfer insulated gate field effect transistor, said gates of said first and second driver insulated gate field effect transistors and said gates of said first and second transfer insulated gate field effect transistors being formed by a first level conductive layer on said major surface of said semiconductor substrate, a first coupling layer for coupling sources of said first and second driver insulated gate field effect transistors with a predetermined potential being formed on said major surface of said semiconductor substrate, a second coupling layer for coupling either a source or a drain of said first transfer insulated gate field effect transistor with said first line of said complementary data line pair being formed on said major surface of said semiconductor substrate, a third coupling layer for coupling either a source or a drain of said second transfer insulated gate field effect transistor with said second line of said complementary data line pair being formed on said major surface of said semiconductor substrate, said first coupling layer, said second coupling layer and said third coupling layer being formed by a second level conductive layer on said major surface of said semiconductor substrate, said gates of said first and second load insulated gate field effect transistors being formed by a third level conductive layer on said major surface of said semiconductor substrate, sources and said drains of said first and second load insulated gate field effect transistors being formed by a fourth level conductive layer on said major surface of said semiconductive substrate;

said first line and said second line of said complementary data line pair being formed by a fifth level conductive layer on said major surface of said semiconductor substrate, said first line of said complementary data line pair formed by said fifth level conductive layer being coupled with either said source or said drain of said first transfer insulated gate field effect transistor via said second coupling layer formed by said second level conductive layer, said second line of said complementary data line pair formed by said fifth level conductive layer being coupled with either said source or said drain of said second transfer insulated gate field effect transistor via said third coupled layer formed by said second level conductive layer, and said second level conductive layer being patterned using a photo-mask having a phase shifter so as to form said first coupling layer, said second coupling layer and said third coupling layer.

2. A semiconductor memory device according to claim 1, wherein said first coupling layer is electrically isolated from said second coupling layer and said third coupling layer by a predetermined distance.

3. A semiconductor memory device according to claim 2, wherein said predetermined distance is a range of 0.1 to 0.4 $\mu$m.

4. A semiconductor memory device according to claim 3, wherein said first and said second driver insulated gate field effect transistor and said first and said second transfer insulated gate field effect transistor are N-channel MOS transistors, and said first and said second load insulated gate field effect transistors are P-channel MOS transistors.

* * * * *